(12) United States Patent
Kishida et al.

(10) Patent No.: US 10,594,012 B2
(45) Date of Patent: Mar. 17, 2020

(54) MULTILAYER SUBSTRATE INCLUDING PLURAL GROUND PLANE LAYERS, WHERE THERE ARE FEWER GROUND PLANE LAYERS IN INPUT AND OUTPUT REGIONS THAN IN AN INTERMEDIATE REGION AND A RADAR DEVICE FORMED THEREFROM

(71) Applicant: Furuno Electric Co., Ltd., Hyogo (JP)

(72) Inventors: Takehiro Kishida, Hyogo (JP); Shuhei Inoue, Hyogo (JP)

(73) Assignee: Furuno Electric Co., Ltd., Hyogo (JP)

( * ) Notice: Subject to any disclaimer, the term of this patent is extended or adjusted under 35 U.S.C. 154(b) by 0 days.

(21) Appl. No.: 15/777,212

(22) PCT Filed: Oct. 25, 2016

(86) PCT No.: PCT/JP2016/081544
§ 371 (c)(1),
(2) Date: May 18, 2018

(87) PCT Pub. No.: WO2017/086100
PCT Pub. Date: May 26, 2017

(65) Prior Publication Data
US 2018/0331407 A1    Nov. 15, 2018

(30) Foreign Application Priority Data
Nov. 20, 2015  (JP) ................................ 2015-227747

(51) Int. Cl.
*H01P 3/00*    (2006.01)
*H01P 3/08*    (2006.01)
(Continued)

(52) U.S. Cl.
CPC .............. *H01P 3/006* (2013.01); *G01S 7/032* (2013.01); *H01P 1/212* (2013.01); *H01P 3/003* (2013.01);
(Continued)

(58) Field of Classification Search
CPC .......... H01P 3/082; H01P 3/088; H01P 3/003; H01P 3/006; H01P 5/028
(Continued)

(56) References Cited

U.S. PATENT DOCUMENTS 6,518,864 B1    2/2003   Ito et al.
7,224,239 B2 *  5/2007   Ulm et al. .............. H01P 1/268
                                                 333/22 R
(Continued)

FOREIGN PATENT DOCUMENTS

JP    2000100994    4/2000
JP    2000269707    9/2000
(Continued)

OTHER PUBLICATIONS

"International Search Report (Form PCT/ISA/210)" of PCT/JP2016/081544, dated Dec. 27, 2016, with English translation thereof, pp. 1-4.
(Continued)

*Primary Examiner* — Benny T Lee
(74) *Attorney, Agent, or Firm* — JCIPRNET

(57) ABSTRACT

To provide a multilayer substrate for transmitting/receiving a high frequency signal, the substrate having a simplified configuration and excellent high frequency characteristics. This disclosure pertains to a multilayer substrate provided with: a plurality of dielectric layers laminated together with ground layers interposed therebetween; and a signal line for inputting and outputting a signal, the signal line being formed on the surface of the dielectric layer. The plurality of ground layers include an input-side ground layer part formed in the region on the signal-input side of the signal line, an output-side ground layer part formed in the region on the signal-output side of the signal line, and an intermediate ground layer part formed in the region between the input-
(Continued)

side ground layer part and the output-side ground layer part. The input-side ground layer part and the output-side ground layer part each have fewer layers than the intermediate ground layer part.

18 Claims, 22 Drawing Sheets

(51) Int. Cl.
*H01P 5/02* (2006.01)
*G01S 7/03* (2006.01)
*H01P 1/212* (2006.01)
*H05K 1/02* (2006.01)
*H05K 1/11* (2006.01)

(52) U.S. Cl.
CPC ............... *H01P 3/08* (2013.01); *H01P 3/082* (2013.01); *H01P 5/028* (2013.01); *H05K 1/0216* (2013.01); *H05K 1/115* (2013.01); *H01P 5/022* (2013.01); *H05K 2201/0195* (2013.01)

(58) Field of Classification Search
USPC .................................................... 333/238, 34
See application file for complete search history.

(56) References Cited

U.S. PATENT DOCUMENTS

| | | | |
|---|---|---|---|
| 7,932,957 B2 | 4/2011 | Azuma et al. | |
| 9,318,786 B2* | 4/2016 | Kato | H05K 1/0253 |
| 2004/0174228 A1* | 9/2004 | Kanno | H01L 23/66 |
| | | | 333/34 |
| 2005/0045376 A1 | 3/2005 | Lee et al. | |
| 2006/0191714 A1 | 8/2006 | Lee et al. | |
| 2007/0241844 A1* | 10/2007 | Kim et al. | H01P 3/003 |
| | | | 333/238 |
| 2013/0154773 A1 | 6/2013 | Siprak | |

FOREIGN PATENT DOCUMENTS

| | | |
|---|---|---|
| JP | 2005080281 | 3/2005 |
| JP | 2005-244110 | 9/2005 |
| JP | 2007-074613 | 3/2007 |
| WO | 2012028064 | 3/2012 |

OTHER PUBLICATIONS

William H. Haydl, "On the Use of vias in Conductor-Backed Coplanar Circuits," IEEE Transactions on Microwave Theory and Techniques, vol. 50, No. 6, Jun. 2002, pp. 1571-1577.

Michael R. Lyons, et al., "Enhanced Dominant Mode Operation of a Shielded Multilayer Coplanar Waveguide via Substrate Compensation," IEEE Transactions on Microwave Theory and Techniques, vol. 41, No. 9, Sep. 1993, pp. 1564-1567.

"Search Report of Europe Counterpart Application", dated Jul. 1, 2019, pp. 1-8.

Rick Sturdivant et al., "Transitions and interconnects using coplanar waveguide and other three conductor transmission lines", 1996 IEEE MTT-S International Microwave Symposium Digest , Jun. 17-21, 1996, pp. 235-238.

* cited by examiner

MULTILAYER SUBSTRATE INCLUDING PLURAL GROUND PLANE LAYERS, WHERE THERE ARE FEWER GROUND PLANE LAYERS IN INPUT AND OUTPUT REGIONS THAN IN AN INTERMEDIATE REGION AND A RADAR DEVICE FORMED THEREFROM

CROSS-REFERENCE TO RELATED APPLICATION

This application is a 371 application of the international PCT application serial no. PCT/JP2016/081544, filed on Oct. 25, 2016, which claims the priority benefit of Japan application no. 2015-227747, filed on Nov. 20, 2015. The entirety of each of the above-mentioned patent applications is hereby incorporated by reference herein and made a part of this specification.

TECHNICAL FIELD

The present disclosure relates to a multilayer substrate used for transmitting/receiving a high frequency signal, and a radar device having the multilayer substrate.

BACKGROUND ART

In a conventional multilayer substrate for transmitting/receiving a high frequency signal, for example, a filter circuit or a matching circuit is formed on the multilayer substrate to suppress harmonic waves.

Further, Patent Literature 1 discloses that a multilayer substrate having good high frequency characteristics can be formed by exposing an inner conductive layer in a multilayer substrate and bringing an exposed portion of the inner conductive layer into contact with a casing as a system ground.

CITATION LIST

Patent Literature

Patent Literature 1

Japanese Unexamined Patent Application Publication No. 2005-244110

SUMMARY

Technical Problem

However, when the filter circuit or the matching circuit is formed on the multilayer substrate as described above, accordingly, a conductive pattern of the multilayer substrate becomes complicated.

Further, in the multilayer substrate disclosed in Patent Literature 1, in order to externally expose the inner conductive layer to the outside, Patent Literature 1 is necessary to form a concave or stepped portion in the substrate, and a shape of the substrate becomes complicated, and thus it is not preferable in terms of cost.

The present disclosure has been made to solve the above-described problems, and an object thereof is to provide a multilayer substrate having a simplified configuration and excellent high frequency characteristics.

Solution to the Problem (1) To solve the above-described problems, a multilayer substrate according to one aspect of the present disclosure includes a plurality of dielectric layers each of which has a ground layer provided on both surfaces thereof and stacked on each other via the ground layers, a signal line formed on a surface of the dielectric layers, a plurality of vias electrically connecting the plurality of ground layers by passing through at least one of the plurality of dielectric layers in a stacking direction of the plurality of dielectric layers, wherein the plurality of ground layers includes an input side ground layer formed in an input side region of the signal line through which the signal is input, an output side ground layer formed in an output side region of the signal line through which the signal is output, and an intermediate ground layer formed in an intermediate region between the input side ground layer and the output side ground layer, and each of the input side ground layer and the output side ground layer has fewer layers than the intermediate ground layer.

(2) Two input side ground layers and two output side ground layers may be formed, and three or more intermediate ground layers may be formed.

(3) The plurality of vias may include a plurality of first vias and a plurality of second vias formed in the intermediate region, the plurality of first vias may be arranged in a direction parallel to the signal line on one side of the signal line in a width direction, the plurality of second vias may be arranged in a direction parallel to the signal line on the other side of the signal line in the width direction, and a distance between the plurality of first vias and the plurality of second vias may be set to be equal to or more than a half wavelength of a harmonic wave of the signal transmitted and received through the signal line and less than a wavelength of the harmonic wave.

(4) A length of an intermediate region signal line portion formed in the intermediate region of the signal line may be set to be an integral multiple of the half wavelength of the harmonic wave.

(5) A length of an input side region signal line portion formed in the input side region of the signal line may be set on the basis of an impedance of the harmonic wave.

(6) The signal line may be formed on one surface of the multilayer substrate, the plurality of vias may have a plurality of first vias and a plurality of second vias formed in the intermediate region, the plurality of first vias may be arranged in a direction parallel to the signal line on one side of the signal line in a width direction, the plurality of second vias may be arranged in a direction parallel to the signal line on the other side of the signal line in the width direction, the ground layer provided on a side closest to the ground layer formed in the same layer as the signal line among the plurality of ground layers in the stacking direction may be provided as a short distance ground layer, the ground layer provided on a side furthest from the ground layer formed in the same layer as the signal line among the plurality of ground layers in the stacking direction may be provided as a long distance ground layer, and a value obtained by adding a distance from the intermediate region signal line portion formed in the intermediate region of the signal line to the first via or the second via and a distance from the short distance ground layer to the long distance ground layer may be set to be a quarter of the wavelength of the harmonic wave transmitted and received through the signal line.

(7) The plurality of vias may have a plurality of first vias, a plurality of second vias, a plurality of third vias and a plurality of fourth vias formed in the intermediate ground layer, the plurality of first vias may be arranged in a direction parallel to the signal line on one side of the signal line in a width direction, the plurality of second vias may be arranged in a direction parallel to the signal line on the other side of the signal line in the width direction, the plurality of third vias may be arranged in a direction parallel to the signal line between the plurality of first vias and the signal line, the plurality of fourth vias may be arranged in a direction parallel to the signal line between the plurality of second vias and the signal line, the ground layer formed in the same layer as the signal line among the plurality of ground layers may be provided as a reference ground layer, the ground layer provided on a side furthest from the reference ground layer among the plurality of ground layers in the stacking direction may be provided as a first long distance ground layer, the ground layer closest to the first long distance ground layer among the plurality of ground layers in the stacking direction may be provided as a second long distance ground layer, the first via and the second via may extend in the stacking direction to electrically connect the first long distance ground layer and the second long distance ground layer, or electrically connect the reference ground layer and the first long distance ground layer, and a distance between the first via and the second via may be set to be equal to or more than a half wavelength of a secondary harmonic wave of the signal transmitted and received through the signal line and less than a wavelength of the secondary harmonic wave, and the third via and the fourth via may extend in the stacking direction to electrically connect the reference ground layer and the second long distance ground layer, and a distance between the third via and the fourth via may be set to be equal to or more than a half wavelength of a tertiary harmonic wave of the signal transmitted and received through the signal line and less than a wavelength of the tertiary harmonic wave.

(8) To solve the above-described problems, a radar device according to one aspect of the present disclosure includes the above-described multilayer substrate.

According to the present disclosure, it is possible to provide a multilayer substrate having a simplified configuration and good high frequency characteristics.

DETAIL DESCRIPTION OF THE EMBODIMENTS

Hereinafter, modes for implementing the present disclosure will be described with reference to the drawings, where like features in the different drawing figures are denoted by the same reference number. The present disclosure can be widely applied to a multilayer substrate for transmitting and receiving signals and a radar device having the multilayer substrate.

Figure 1:
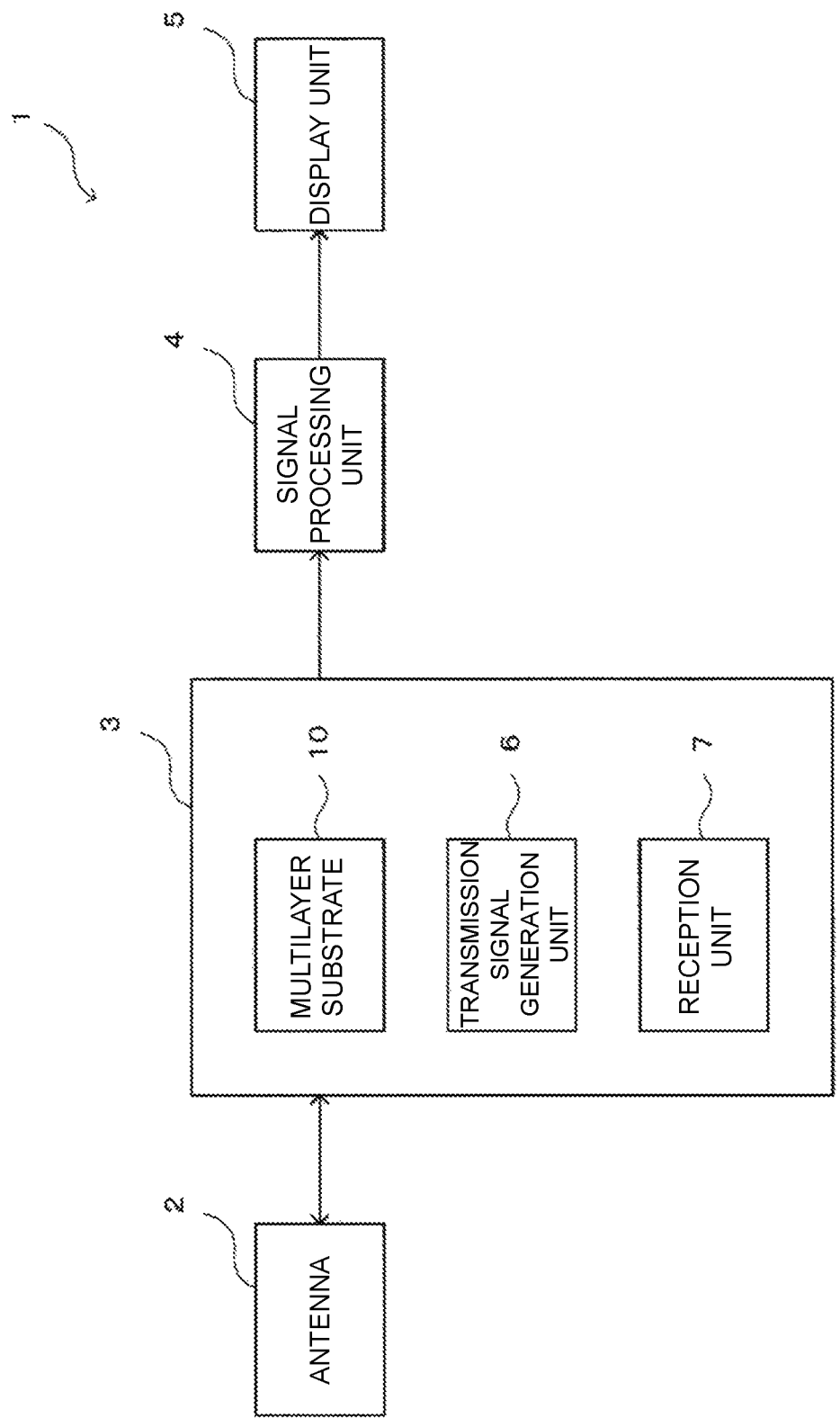
FIG. 1 is a block diagram of a radar device having a multilayer substrate according to an embodiment of the present disclosure.

FIG. 1 is a block diagram of a radar device 1 having a multilayer substrate 10 according to an embodiment of the present disclosure. The radar device 1 according to the embodiment is mounted in, for example, a vessel as a ship and is used for detecting another ship.

In the radar device 1, a transmission wave generated from a transmission signal generated by a transmission/reception device 3 is transmitted from an antenna 2, and a reflection wave in which a transmission wave is reflected by a target and returns is received by the antenna 2 as a reception wave. In the radar device 1, a signal processing unit 4 processes a received signal obtained from the reception wave and generates information (for example, a video signal of an echo image of the target) on the target, and the information is displayed on a display unit 5.

Additionally, the multilayer substrate 10 according to the embodiment of the present disclosure is used for the transmission/reception device 3. Specifically, the multilayer substrate 10 has an input side terminal 17 and an output side terminal 18 (refer to FIG. 2). In the multilayer substrate 10, in a state in which it is connected to a transmission signal generation unit 6 of the transmission/reception device 3 by a transmission/reception switching unit (not illustrated), the transmission signal generated by the transmission signal generation unit 6 is input to the input side terminal 17 and the transmission signal is output to the antenna 2 side via the output side terminal 18. On the other hand, in the multilayer substrate 10, in a state in which it is connected to a reception unit 7 of the transmission/reception device 3 by the transmission/reception switching unit, a reception signal obtained from the reception wave received by the antenna 2 is input from the output side terminal 18, and the received signal is output to the reception unit 7 via the input side terminal 17. The reception unit 7 outputs the received signal to the signal processing unit 4 after an A/D conversion of the reception signal.

[Configuration of the Multilayer Substrate]

Figure 2:
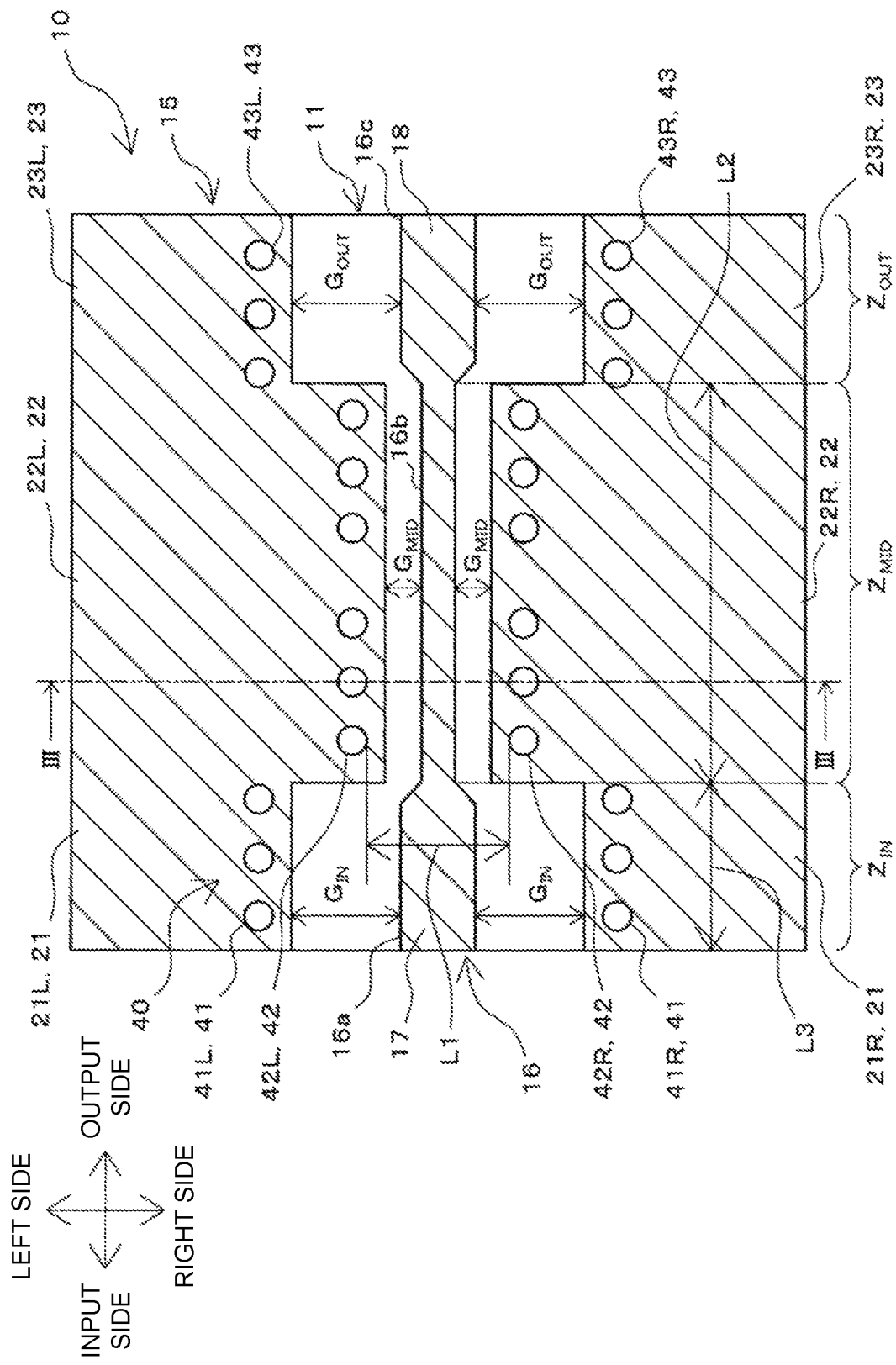
FIG. 2 is a plan view of the multilayer substrate illustrated in FIG. 1 and is a view illustrating a conductive pattern (i.e. first conductive pattern) of a top layer (i.e. first layer) with diagonal lines.
Figure 3:
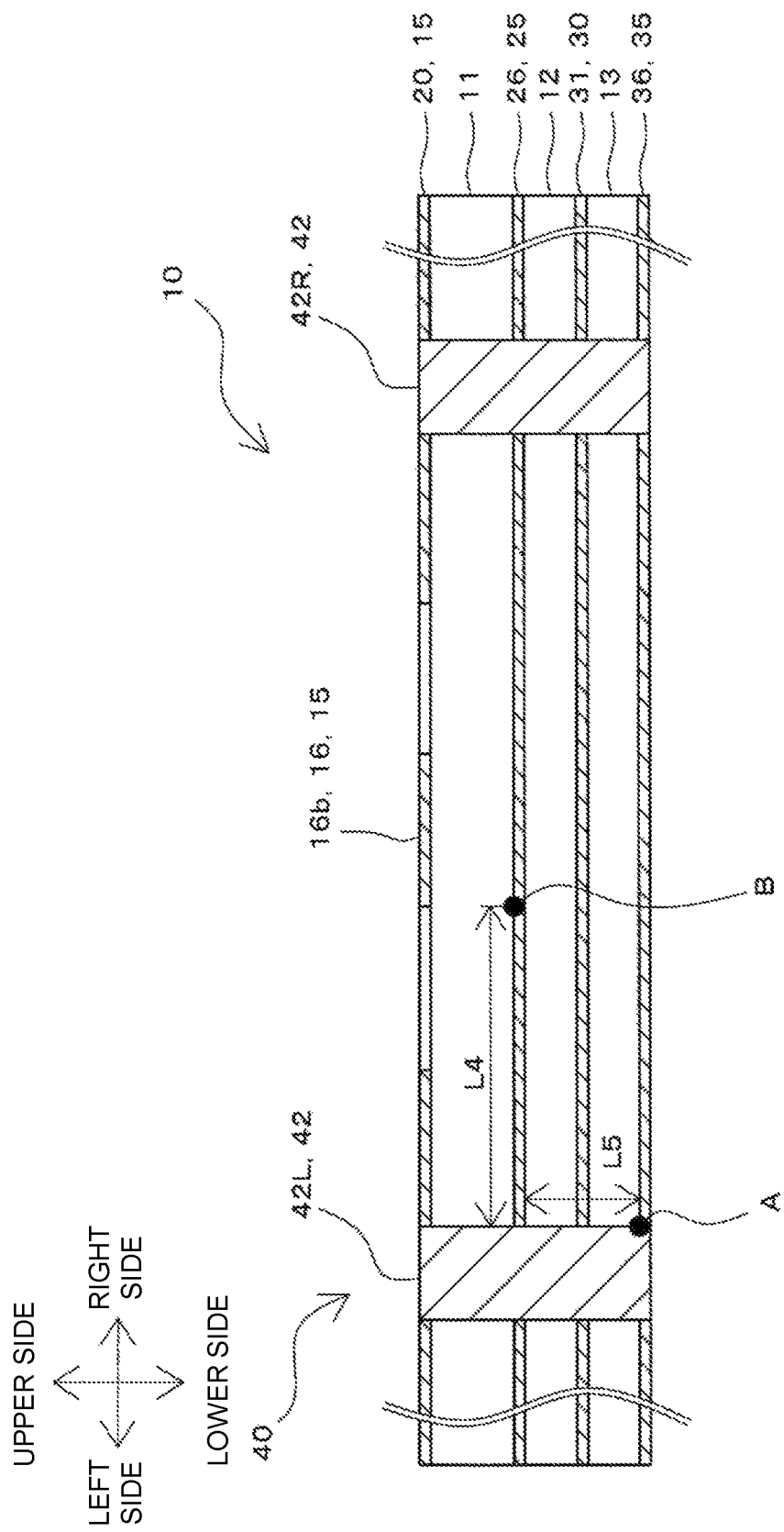
FIG. 3 is a schematic view illustrating a cross-sectional shape of the multilayer substrate taken along line III-III illustrated in FIG. 2 and is a view illustrating a state in which a part thereof is omitted.
Figure 4:
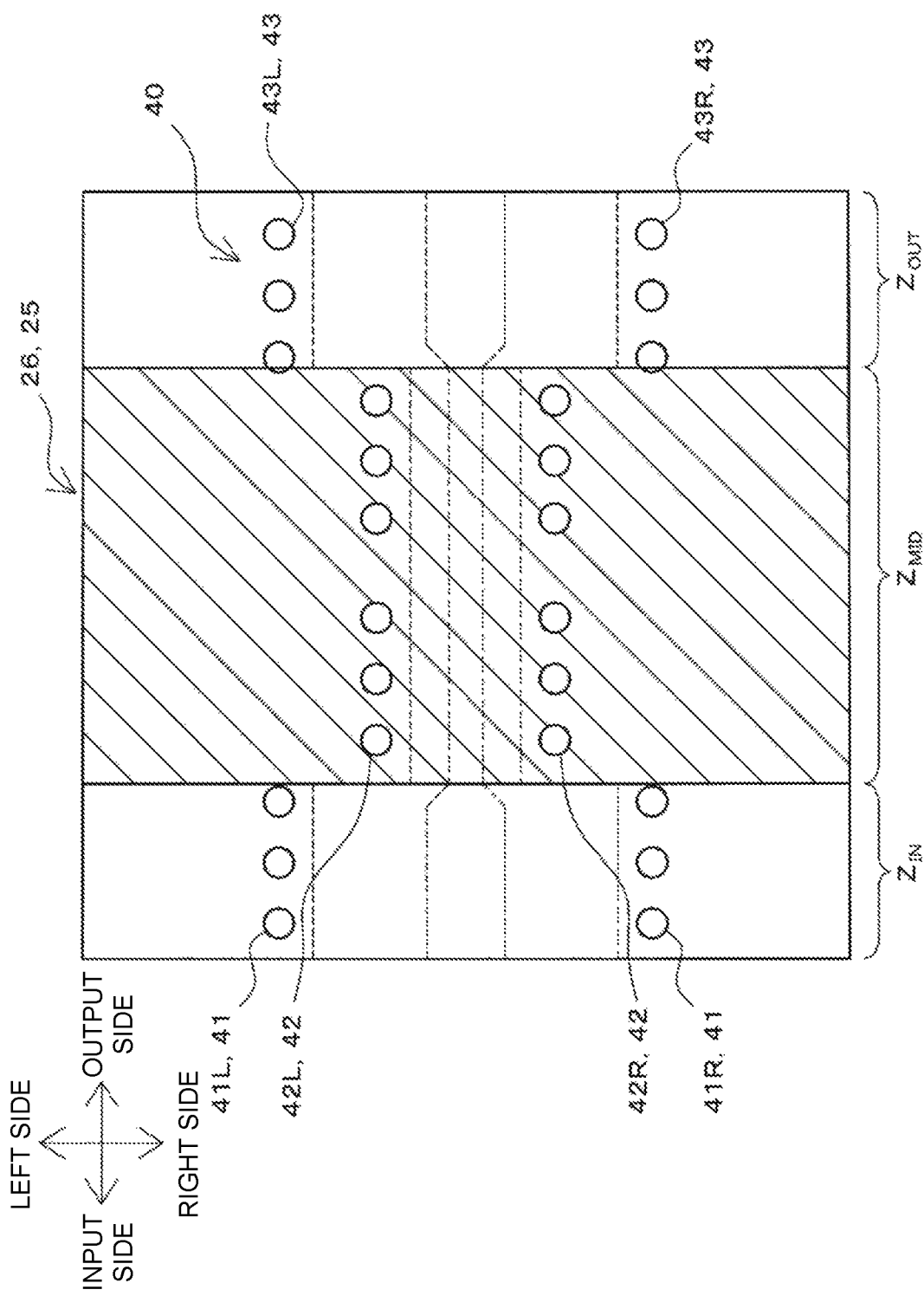
FIG. 4 is a top view of a conductive pattern (i.e. second conductive pattern) of a second layer from the top and is a view illustrating a second conductive pattern with diagonal lines.
Figure 5:
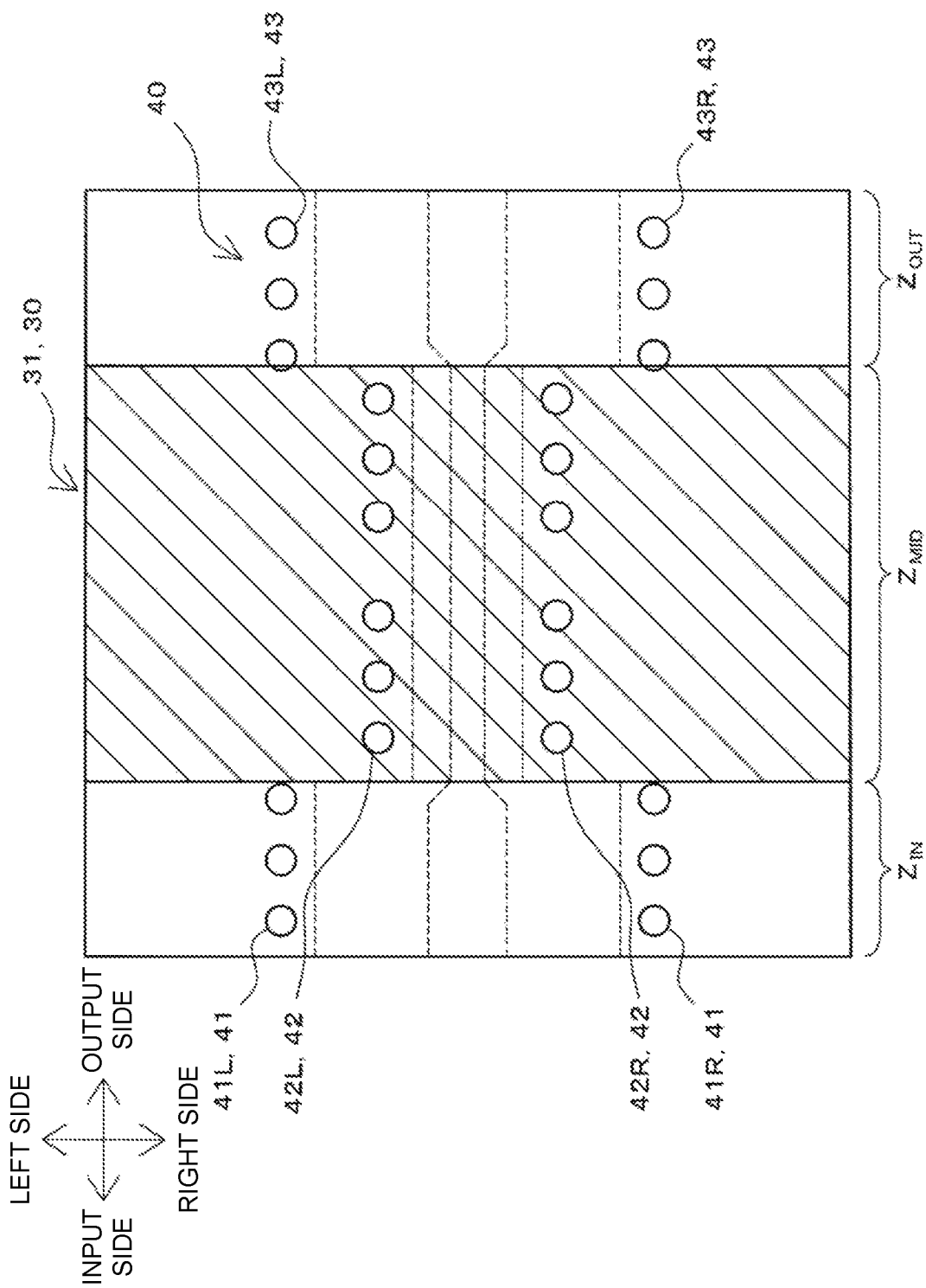
FIG. 5 is a top view of a conductive pattern (i.e. third conductive pattern) of a third layer from the top and is a view illustrating a third conductive pattern with diagonal lines.
Figure 6:
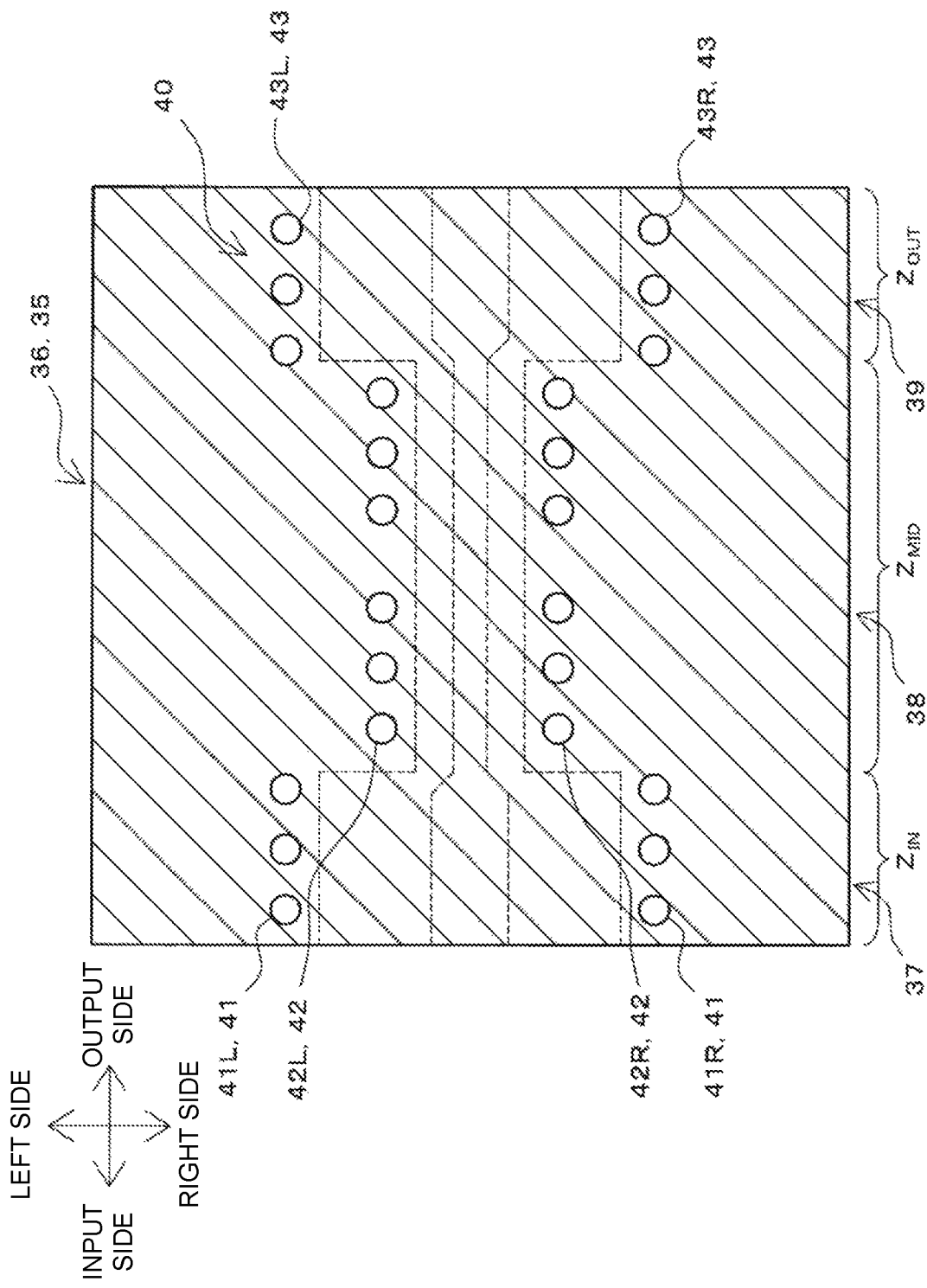
FIG. 6 is a top view of a conductive pattern (i.e. fourth conductive pattern) of a bottom layer (i.e. fourth layer) and is a view illustrating a fourth conductive pattern with diagonal lines.

FIG. 2 is a plan view of the multilayer substrate 10 illustrated in FIG. 1 and is a view illustrating a conductive pattern (i.e. first conductive pattern 15) of a top layer (i.e. first layer) with diagonal lines. Also, FIG. 3 is a schematic view illustrating a cross-sectional shape of the multilayer substrate 10 taken along line III-III illustrated in FIG. 2 and is a view illustrating a state in which a part thereof is omitted. Also, FIG. 4 is a top view of a conductive pattern (i.e. second conductive pattern 25) of a second layer from the top and is a view illustrating a second conductive pattern 25 with diagonal lines. Also, FIG. 5 is a top view of a conductive pattern (i.e. third conductive pattern 30) of a third layer from the top and is a view illustrating a third conductive pattern 30 with diagonal lines. Also, FIG. 6 is a top view of a conductive pattern (i.e. fourth conductive pattern 35) of a bottom layer (i.e. fourth layer) and is a view illustrating a fourth conductive pattern 35 with diagonal lines. Further, in FIG. 3, to avoid making the drawing complicated, hatching of dielectric layers 11, 12 and 13 is omitted, and a longitudinal dimension of each component with respect to a transverse dimension thereof does not necessarily correspond to an actual dimension. In addition, in FIGS. 4 to 6, an outer shape of the first conductive pattern 15 shown in FIG. 3 is illustrated to be superimposed with a broken line.

Further, in each of the drawings (i.e., FIG. 2 to FIG. 6, FIG. 17 to FIG. 18, and FIG. 22), for convenience of explanation, a direction indicated by an arrow marked as an input side is referred to as the "input side", a direction indicated by an arrow marked as an output side is referred to as the "output side", a direction indicated by an arrow marked as a right side is referred to as the "right side", a direction indicated by the arrow marked as a left side is referred to as the "left side", a direction indicated by an arrow marked as an upper side is referred to as the "upper side" or "upper direction", and a direction indicated by an arrow marked as a lower side is referred to as the "lower side" or "lower direction".

The multilayer substrate 10 of the embodiment is a so-called four-layer substrate (i.e. a substrate in which four conductive layers are formed) and is a substrate having a particular thickness formed in a rectangular shape in a plan view. The multilayer substrate 10 may be divided into three regions in a plan view. Specifically, referring to FIGS. 2, 4 and 6, the multilayer substrate 10 (FIG. 2) may be divided into an input side region $Z_{IN}$ on the side in which a signal is input, an output side region $Z_{OUT}$ in which a signal is output, and an intermediate region $Z_{MID}$ sandwiched between the input side region $Z_{IN}$ and the output side region $Z_{OUT}$.

The multilayer substrate 10 has three dielectric layers 11 (FIGS. 2 and 3), 12 (FIG. 3) and 13 (FIG. 3) and four conductive patterns 15 (FIGS. 2 and 3), 25 (FIGS. 3 and 4), 30 (FIGS. 3 and 5) and 35 (FIGS. 3 and 6).

The three dielectric layers 11, 12 and 13 include a first dielectric layer 11, a second dielectric layer 12 and a third dielectric layer 13.

The first dielectric layer 11 is a dielectric layer provided at the top side among the three dielectric layers, the first conductive pattern 15 is formed on an upper side thereof, and the second conductive pattern 25 is formed on a lower side thereof.

The second dielectric layer 12 is a dielectric layer formed under the first dielectric layer 11 and is provided in close contact with a lower surface of the second conductive pattern 25. The third conductive pattern 30 is provided in close contact with a lower surface of the second dielectric layer 12.

The third dielectric layer 13 is a dielectric layer formed under the second dielectric layer 12. The third conductive pattern 30 is formed on an upper side of the third dielectric layer 13, and the fourth conductive pattern 35 is formed in close contact with a lower side thereof.

The four conductive patterns 15, 25, 30 and 35 include the first conductive pattern 15, the second conductive pattern 25, the third conductive pattern 30, and the fourth conductive pattern 35.

Referring to FIG. 2, the first conductive pattern 15 is formed on a front side (i.e. upper side) surface of the first dielectric layer 11. That is, the first conductive pattern 15 is provided as the top conductive pattern and is exposed on the front side (i.e. upper side) surface of the multilayer substrate 10.

Referring to FIG. 2 and FIG. 3, the first conductive pattern 15 includes a signal line 16 (FIG. 2) and a first ground pattern 20 in FIG. 3 (i.e. ground layer).

Referring to FIG. 2, the signal line 16 is a conductive pattern which linearly extends from an input side end of the multilayer substrate 10 to an output side end thereof at a center portion of the multilayer substrate 10 in a rightward and leftward direction. The signal line 16 includes an input side region signal line portion 16a formed in the input side region $Z_{IN}$, an intermediate region signal line portion 16b formed in the intermediate region $Z_{MID}$, and an output side region signal line portion 16c formed in the output side region $Z_{OUT}$. An input side end of the signal line 16 is provided as the input side terminal 17 to which the transmission signal generated by the transmission signal generation unit 6 (refer to FIG. 1) is input. Also, an output side end of the signal line 16 is provided as the output side terminal 18 through which a signal passing through the signal line 16 is output to the antenna 2 (FIG. 1) side.

The first ground pattern 20 is a portion provided as a ground surface in the first conductive pattern. That is, the first ground pattern 20 is formed not to be in contact with the signal line 16. The first ground pattern 20 includes an input side region ground layer 21, an intermediate region ground layer 22, and an output side region ground layer 23.

The input side region ground layer 21 is a portion formed in the input side region $Z_{IN}$ of the first ground pattern 20. The input side region ground layer 21 includes an input side region right ground layer 21R formed in a right side of the input side region $Z_{IN}$, and an input side region left ground layer 21L formed in a left side of the input side region $Z_{IN}$. Each of the input side region right ground layer 21R and the input side region left ground layer 21L is formed in a rectangular shape. A distance $G_{IN}$ in the rightward and leftward direction between the input side region right ground layer 21R and the signal line 16, and a distance $G_{IN}$ in the rightward and leftward direction between the input side region left ground layer 21L and the signal line 16 are appropriately set by a designer.

The intermediate region ground layer 22 is a portion formed in the intermediate region $Z_{MID}$ of the first ground pattern 20. The intermediate region ground layer 22 includes an intermediate region right ground layer 22R formed in a right side of the intermediate region $Z_{MID}$, and an intermediate region left ground layer 22L formed in a left side of the intermediate region $Z_{MID}$. Each of the intermediate region right ground layer 22R and the intermediate region left ground layer 22L is formed in a rectangular shape. The intermediate region right ground layer 22R is integrally formed with the input side region right ground layer 21R, and the intermediate region left ground layer 22L is integrally formed with the input side region left ground layer 21L. A distance $G_{MID}$ in the rightward and leftward direction between the intermediate region right ground layer 22R and the signal line 16, and a distance $G_{MID}$ in the rightward and leftward direction between the intermediate region left ground layer 22L and the signal line 16 are set shorter than the above-described distances $G_{IN}$. That is, the intermediate region right ground layer 22R and the intermediate region left ground layer 22L are respectively provided to protrude toward the signal line 16 side than the input side region right ground layer 21R and the input side region left ground layer 21L.

The output side region ground layer 23 is a portion formed in the output side region $Z_{OUT}$ of the first ground pattern 20. The output side region ground layer 23 includes an output side region right ground layer 23R formed in a right side of the output side region $Z_{OUT}$, and an output side region left ground layer 23L formed in a left side of the output side region $Z_{OUT}$. Each of the output side region right ground layer 23R and the output side region left ground layer 23L is formed in a rectangular shape. The output side region right ground layer 23R is integrally formed with the intermediate region right ground layer 22R, and the output side region left ground layer 23L is integrally formed with the intermediate region left ground layer 22L. A distance $G_{OUT}$ in the rightward and leftward direction between the output side region right ground layer 23R and the signal line 16, and a distance $G_{OUT}$ in the rightward and leftward direction between the output side region left ground layer 23L and the signal line 16 are set to be equal to the above-described distances $G_{IN}$.

Referring to FIG. 3, the second conductive pattern 25 is formed between the first dielectric layer 11 and the second dielectric layer 12. That is, the second conductive pattern 25 is provided as a second conductive pattern from the top and is embedded in the multilayer substrate 10.

Referring to FIG. 4, the second conductive pattern 25 is constituted by a second ground pattern 26 (i.e. ground layer or short distance ground layer). The second ground pattern 26 is uniformly formed in the intermediate region $Z_{MID}$ and is not formed in the input side region $Z_{IN}$ and the output side region $Z_{OUT}$. That is, the second ground pattern 26 is provided as an intermediate ground layer.

Referring to FIG. 3, the third conductive pattern 30 is provided between the second dielectric layer 12 and the third dielectric layer 13. That is, the third conductive pattern 30 is provided as a third conductive pattern from the top and is embedded in the multilayer substrate 10.

Referring to FIG. 5, the third conductive pattern 30 is constituted by a third ground pattern 31 (i.e. ground layer). The third ground pattern 31 is uniformly formed in the intermediate region $Z_{MID}$ and is not formed in the input side region $Z_{IN}$ and the output side region $Z_{OUT}$. That is, the third ground pattern 31 is provided as an intermediate ground layer. The third ground pattern 31 has the same shape as that of the second ground pattern 26 (FIG. 4).

Referring to FIG. 3, the fourth conductive pattern 35 is formed on a back side (i.e. lower side) surface of the third dielectric layer 13. That is, the fourth conductive pattern 35 is provided as a bottom conductive pattern and is exposed at a back side (i.e. lower side) surface of the multilayer substrate 10.

Referring to FIG. 6, the fourth conductive pattern 35 is constituted by a fourth ground pattern 36 (i.e. ground layer or long distance ground layer). The fourth ground pattern 36 is uniformly formed over an entire region on the back surface (i.e. lower surface) of the third dielectric layer 13. The fourth ground pattern 36 includes an input side region ground layer 37 (i.e. input side ground layer) formed in the input side region $Z_{IN}$, an intermediate region ground layer 38 (i.e. intermediate ground layer) formed in the intermediate region $Z_{MID}$, and an output side region ground layer 39 (i.e. output side ground layer) formed in the output side region $Z_{OUT}$. The fourth ground pattern 36 is provided as a system ground of the radar device 1.

Further, referring to FIGS. 2 and 3, a plurality of vias 40 (FIG. 2) are formed in the multilayer substrate 10. Each of the vias 40 vertically passes through the multilayer substrate 10 and electrically connects the ground patterns 20, 26, 31 and 36 of the conductive patterns 15, 25, 30 and 35.

The plurality of vias 40 include a plurality of input side region vias 41 (FIG. 2), a plurality of intermediate region vias 42 (FIG. 2), and a plurality of output side region vias 43 (FIG. 2).

The plurality of input side region vias 41 are vias formed in the input side region $Z_{IN}$. The plurality of input side region vias 41 include a plurality of input side region right vias 41R and a plurality of input side region left vias 41L as shown in FIGS. 2 to 6.

The plurality of (i.e. three in the embodiment) input side region right vias 41R are formed on the right side in the input side region $Z_{IN}$. Specifically, referring to FIG. 2, three input side region right vias 41R are arranged in one row from the input side to the output side on the signal line 16 side in the input side region right ground layer 21R. Referring to FIG. 2 and FIGS. 4 to 6, the input side region right ground layer 21R of the first ground pattern 20 and the fourth ground pattern 36 are electrically connected by the plurality of input side region right vias 41R.

The plurality of (i.e. three in the embodiment) input side region left vias 41L are formed on the left side in the input side region $Z_{IN}$. Specifically, referring to FIG. 2, three input side region left vias 41L are arranged in one row from the input side to the output side on the signal line 16 side in the input side region left ground layer 21L. Referring to FIG. 2, the input side region left ground layer 21L of the first ground pattern 20 and the fourth ground pattern 36 are electrically connected by the plurality of input side region left vias 41L.

The plurality of intermediate region vias 42 are vias formed in the intermediate region $Z_{MID}$. The plurality of intermediate region vias 42 include a plurality of intermediate region right vias 42R (i.e. first vias) and a plurality of intermediate region left vias 42L (i.e. second vias).

The plurality of (i.e. six in the embodiment) intermediate region right vias 42R are formed on the right side in the intermediate region $Z_{MID}$. Specifically, referring to FIG. 2, six intermediate region right vias 42R are arranged in one row from the input side to the output side on the signal line 16 side in the intermediate region right ground layer 22R. Referring to FIG. 2, the intermediate region right ground layer 22R of the first ground pattern 20, the second ground pattern 26 (FIG. 3), the third ground pattern 31 (FIG. 3) and the fourth ground pattern 36 (FIG. 3) are electrically connected by the plurality of intermediate region right vias 42R.

The plurality of (i.e. six in the embodiment) intermediate region left vias 42L are formed on the left side in the intermediate region $Z_{MID}$. Specifically, referring to FIG. 2, six intermediate region left vias 42L are arranged in one row from the input side to the output side on the signal line 16 side in the intermediate region left ground layer 22L. Referring to FIG. 2, the intermediate region left ground layer 22L of the first ground pattern 20, the second ground pattern 26, the third ground pattern 31 and the fourth ground pattern 36 are electrically connected by the plurality of intermediate region left vias 42L.

The plurality of output side region vias 43 are vias formed in the output side region $Z_{OUT}$. The plurality of output side region vias 43 include a plurality of output side region right vias 43R and a plurality of output side region left vias 43L as shown in FIGS. 2 and 4 to 6.

The plurality of (i.e. three in the embodiment) output side region right vias 43R are formed on the right side in the output side region $Z_{OUT}$. Specifically, referring to FIG. 2, three output side region right vias 43R are arranged in one row from the input side to the output side on the signal line 16 side in the output side region right ground layer 23R. Referring to FIG. 2, the output side region right ground layer 23R of the first ground pattern 20 and the fourth ground pattern 36 are electrically connected by the plurality of output side region right vias 43R.

The plurality of (i.e. three in the embodiment) output side region left vias 43L are formed on the left side in the output side region $Z_{OUT}$. Specifically, referring to FIG. 2, three output side region right vias 43R are arranged in one row from the input side to the output side on the signal line 16 side in the output side region left ground layer 23L. Referring to FIG. 2, the output side region left ground layer 23L of the first ground pattern 20 and the fourth ground pattern 36 are electrically connected by the plurality of output side region left vias 43L.

[Regarding the Number of Layers of Ground Pattern in Each Region of Multilayer Substrate]

Incidentally, in a conventional multilayer substrate, a filter circuit or a matching circuit is formed on the multilayer substrate to obtain excellent high frequency characteristics. However, in that case, accordingly, the conductive pattern of the multilayer substrate becomes complicated, and a size of the substrate increases.

Further, Patent Literature 1 discloses that a multilayer substrate having good high frequency characteristics can be formed by exposing an inner conductive layer in the multilayer substrate and bringing an exposed portion of the inner conductive layer into contact with a casing as a system ground. However, in this case, since a shape of the substrate becomes complicated, it is not preferable in terms of cost.

Regarding this point, in the embodiment, referring to FIG. 2 and FIGS. 4 to 6, two layers of ground patterns (i.e. the first ground pattern 20 and the fourth ground pattern 36) are formed in the input side region $Z_{IN}$ and the output side region $Z_{OUT}$ of the multilayer substrate 10. On the other hand, four layers of ground patterns (i.e. the first ground pattern 20, the second ground pattern 26, the third ground pattern 31 and the fourth ground pattern 36) are formed in the intermediate region $Z_{MID}$ of the multilayer substrate 10. That is, the multilayer substrate 10 is formed so that the ground patterns of a portion (i.e. the input side region $Z_{IN}$ and the output side region $Z_{OUT}$) thereof in which the signal is input/output has fewer layers than the ground patterns in the intermediate region $Z_{MID}$. In this case, since the disturbance of an electric field in the portion in which the signal is input/output hardly occurs, a quasi-TEM mode is likely to be formed in that portion. As a result, a transmission characteristic of the signal is improved.

Figure 7:
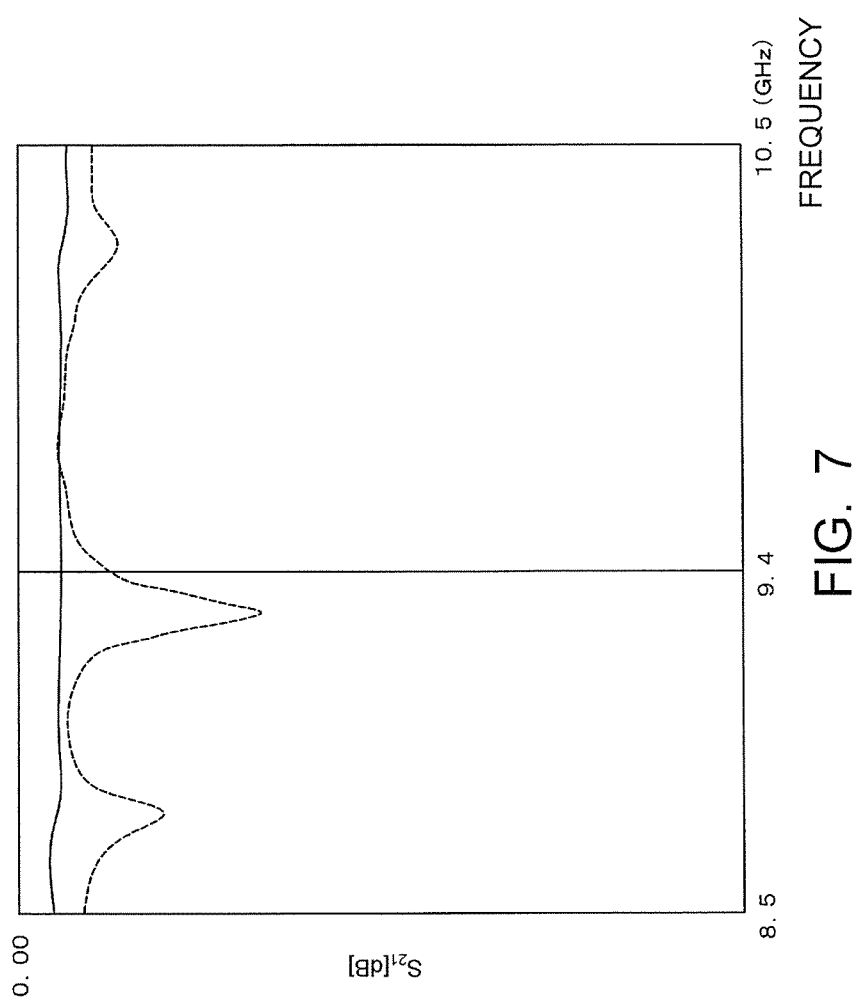
FIG. 7 is a view illustrating a state in which a simulation graph (i.e. illustrated by a broken line in FIG. 7) of a transmission characteristic of a multilayer substrate according to a comparative example is superimposed on a simulation graph (i.e. illustrated by a solid line in FIG. 7) of a transmission characteristic of the multilayer substrate according to the embodiment.
Figure 8:
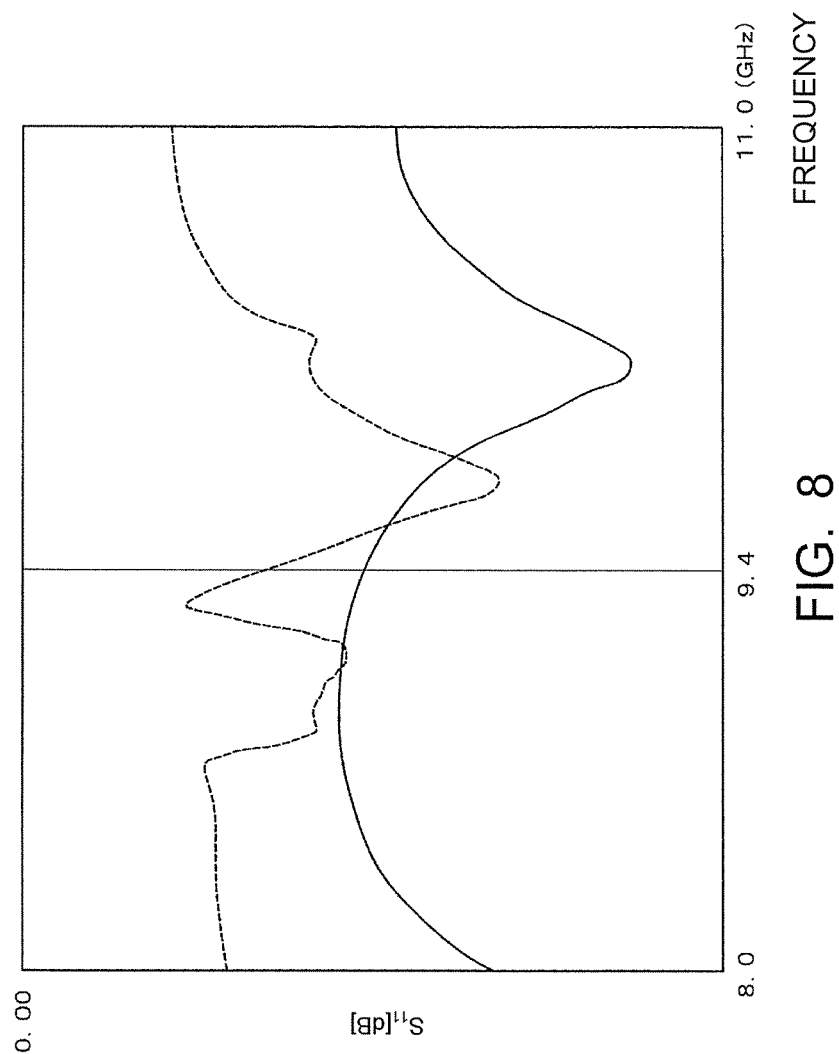
FIG. 8 is a view illustrating a state in which a simulation graph (i.e. illustrated by a broken line in FIG. 8) of a reflection characteristic of the multilayer substrate according to the comparative example is superimposed on a simulation graph (i.e. illustrated by a solid line in FIG. 8) of a reflection characteristic of the multilayer substrate according to the embodiment.

FIG. 7 is a view illustrating a state in which a simulation graph (i.e. illustrated by a broken line in FIG. 7) of a transmission characteristic $S_{21}$ (in dB) vs. frequency (in GHz) of a multilayer substrate according to a comparative example is superimposed on a simulation graph (i.e. illustrated by a solid line in FIG. 7) of a transmission characteristic $S_{21}$ of the multilayer substrate 10 according to the embodiment. Further, FIG. 8 is a view illustrating a state in which a simulation graph (i.e. illustrated by a broken line in FIG. 8) of a reflection characteristic $S_{11}$ (in dB) vs. frequency (in GHz) of the multilayer substrate according to the comparative example is superimposed on a simulation graph (i.e. illustrated by a solid line in FIG. 8) of a reflection characteristic $S_{11}$ of the multilayer substrate 10 according to the embodiment. Also, referring to FIGS. 4 and 5, in a multilayer substrate according to the comparative example, the ground patterns (i.e. the second ground pattern and the third ground pattern) of the inner layers are formed over the entire region (i.e. the input side region $Z_{IN}$, the intermediate region $Z_{MID}$, and the output side region $Z_{OUT}$) of the substrate, and other configurations are the same as those of the multilayer substrate 10.

As illustrated in FIGS. 7 and 8, according to the multilayer substrate 10 of the embodiment, it can be confirmed that excellent transmission and reflection characteristics are obtained in a frequency band (i.e. 9.4 GHz) of the transmitted signal as compared with the multilayer substrate according to the comparative example.

[Regarding Dimensions of Each Part]

Referring to FIGS. 2 and 3, in the multilayer substrate 10 according to the embodiment, dimensions L1, L2, L3 (FIG. 2) and L4, to L5 (FIG. 3) are appropriately set. Therefore, high frequency performance of the multilayer substrate 10 can be enhanced. In the multilayer substrate 10 according to the embodiment, each value of L1 to L5 is set as follows. Specifically, the value of L1 is set to be a half wavelength of a wavelength $\lambda_r$ of a secondary harmonic wave (i.e. 18.8 GHz). Also, the value of L2 is set to be an integral multiple of the half wavelength (i.e. $\lambda_r/2$) of the secondary harmonic wave. Further, as will be described in detail below, by adjusting the value of L3, an impedance of the secondary harmonic wave may be arbitrarily set without affecting an impedance of a fundamental wave (i.e. 9.4 GHz). Further, a value obtained by adding L4 and L5 is set to be a quarter of the wavelength $\lambda_r$ of the secondary harmonic wave (i.e. 18.8 GHz).

[Regarding Dimension L1]

Referring to FIG. 2, L1 is a distance between the intermediate region right via 42R and the intermediate region left via 42L. More specifically, L1 is a distance between an end of the intermediate region right via 42R on the signal line 16 side and an end of the intermediate region left via 42L on the signal line 16 side. In the multilayer substrate 10 according to the embodiment, the dimension of L1 is set to be the half wavelength of the wavelength $\lambda_r$ of the secondary harmonic wave (i.e. 18.8 GHz). Further, the wavelength $\lambda_r$ is a wavelength in consideration of a wavelength shortening effect due to a dielectric constant of the dielectric layer in which the signal line 16 through which the signal is transmitted is formed. The wavelength $\lambda_r$ can be calculated, for example, by dividing the wavelength of the secondary harmonic wave in a vacuum by a square root of the dielectric constant of the dielectric layer.

Figure 9:
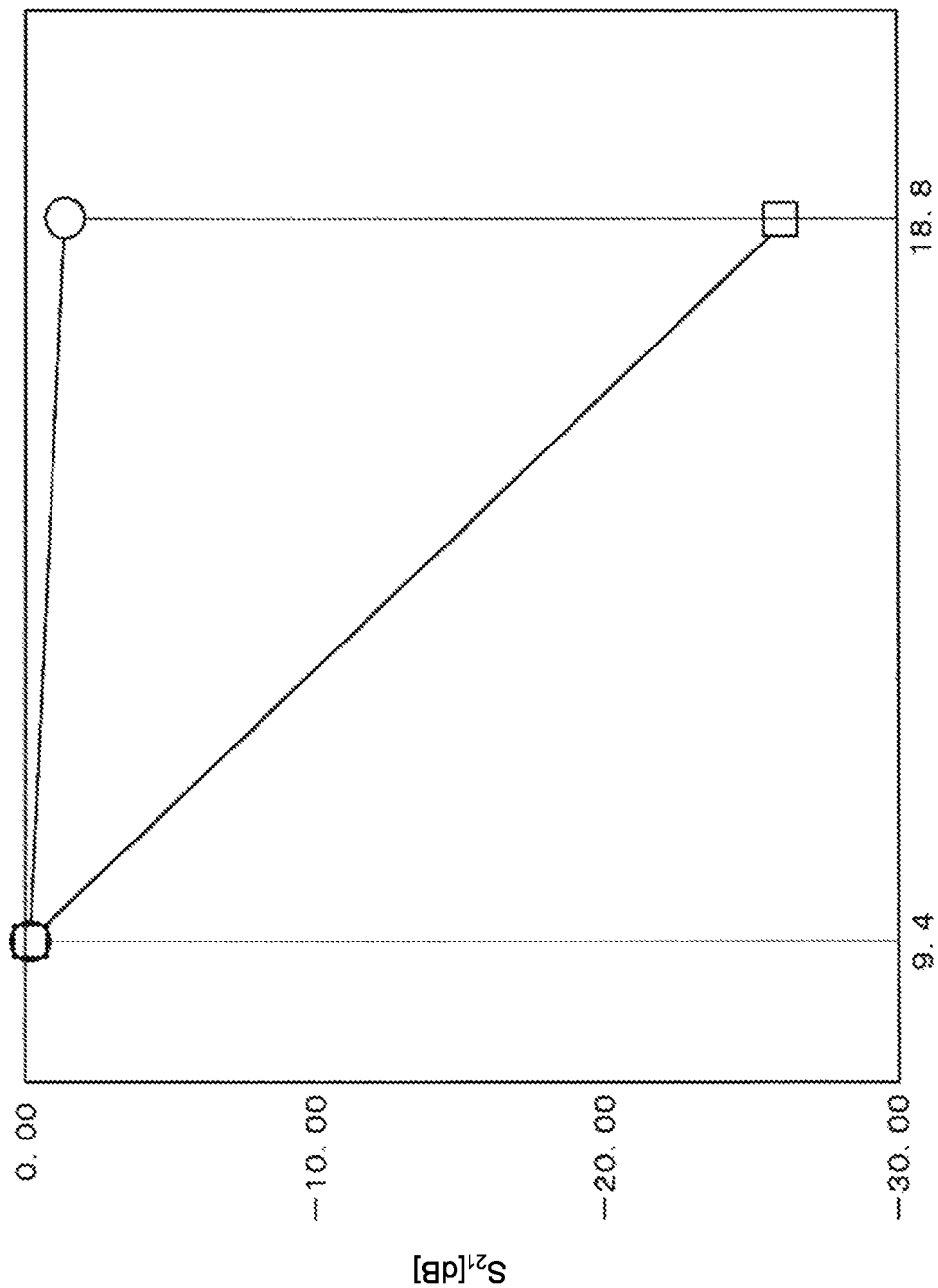
FIG. 9 is a view illustrating a state in which a graph illustrating a simulation result of the transmission characteristic of the multilayer substrate according to the embodiment and a graph illustrating a simulation result of the transmission characteristic of the multilayer substrate according to the comparative example are superimposed.
Figure 10:
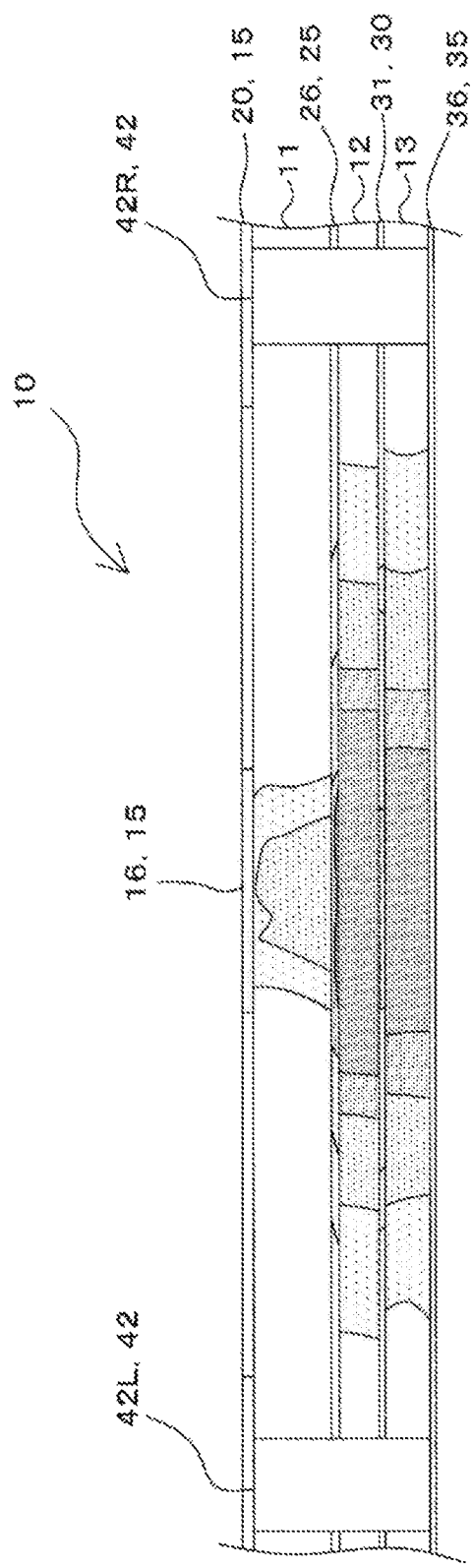
FIG. 10 is an electric field simulation of a secondary harmonic wave in the multilayer substrate according to the embodiment.
Figure 11:
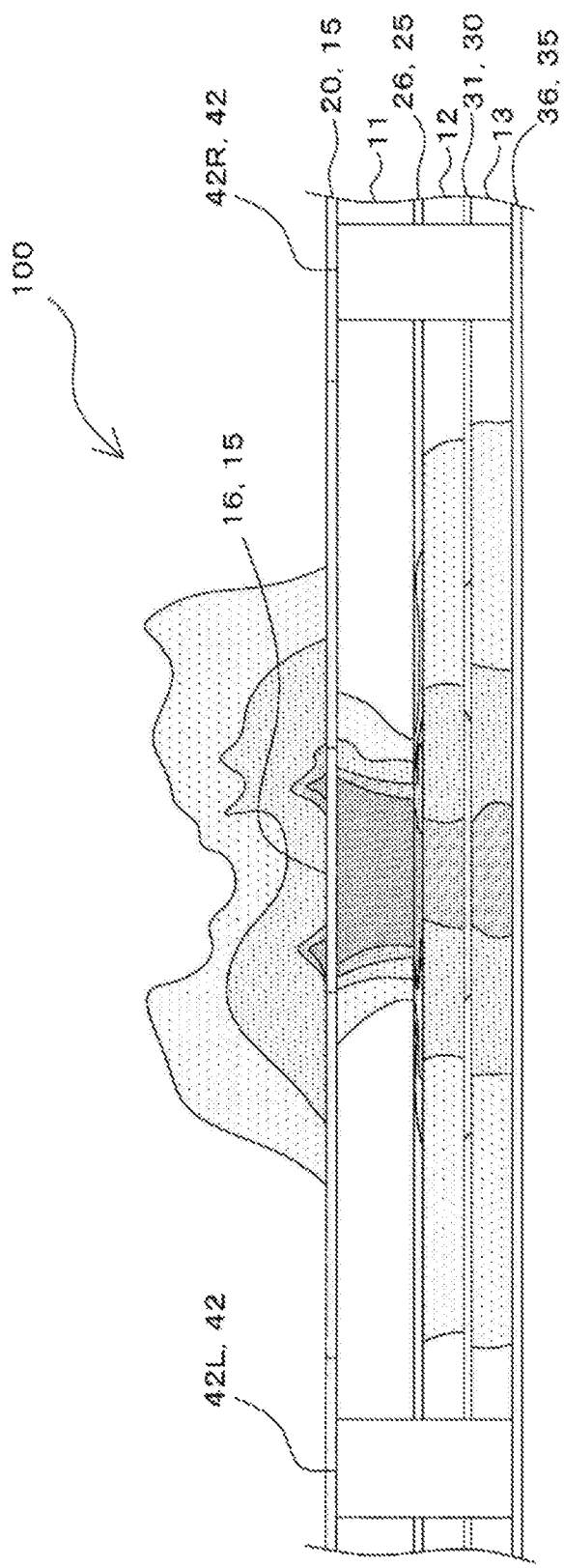
FIG. 11 is an electric field simulation of the secondary harmonic wave in the multilayer substrate according to the comparative example.

FIG. 9 is a view illustrating a state in which a graph (i.e. illustrated by a square in FIG. 9) illustrating a simulation result of the transmission characteristic $S_{21}$ (in dB) vs. frequency (in GHz) of the multilayer substrate 10 according to the embodiment and a graph (i.e. illustrated by a circle in FIG. 9) illustrating a simulation result of the transmission characteristic of the multilayer substrate 100 according to the comparative example are superimposed. Further, FIG. 10 is an electric field simulation of the secondary harmonic wave in the multilayer substrate 10 according to the embodiment. Further, FIG. 11 is an electric field simulation of the secondary harmonic wave in the multilayer substrate 100 according to the comparative example. Also, dimensions of the multilayer substrate 100 according to the comparative example are the same as those of the multilayer substrate 10, except for the fact that the value of L1 (FIG. 2) is set to be a quarter of the wavelength $\lambda_r$ of the secondary harmonic wave (i.e. 18.8 GHz). Also, the electric field simulations illustrated in FIGS. 10 and 11 are electric field simulations when the multilayer substrate is seen from the input side.

As illustrated in FIG. 9, the transmission characteristic of the fundamental wave (i.e. 9.4 GHz) is substantially the same in both the multilayer substrate 10 and the multilayer substrate 100 according to the comparative example. However, regarding the transmission characteristic of the secondary harmonic wave (i.e. 18.8 GHz), the multilayer substrate 10 according to the embodiment has superior characteristics (i.e. it is difficult to transmit the secondary harmonic wave).

The inventor of the present disclosure conducted an electric field simulation, and as illustrated in FIG. 11, according to an electric field simulation result of the multilayer substrate 100 according to the comparative example, it was confirmed that the secondary harmonic wave propagates between the signal line 16 and the conductor of the second layer (i.e. the second ground pattern 26). That is, in the multilayer substrate 100 according to the comparative example, the secondary harmonic wave is transmitted to the output side through the signal line.

On the other hand, according to the electric field simulation in the multilayer substrate 10 according to the embodiment, it was confirmed that the secondary harmonic wave propagates between the conductor of the second layer (i.e. the second conductive pattern 25) and the conductor of the fourth layer (i.e. the fourth conductive pattern 35), as illustrated in FIG. 10. In the second to fourth conductors (i.e. the second conductive pattern 25, the third conductive pattern 30 and the fourth conductive pattern 35), since the output sides are in an open state, it was confirmed that it is difficult for the secondary harmonic wave to propagate to the output side, as illustrated in FIG. 9.

[Regarding Dimension L2]

Referring to FIG. 2, L2 is a length of a portion of the signal line 16 included in the intermediate region $Z_{MID}$, that is, the intermediate region signal line portion 16b. In the multilayer substrate 10 according to the embodiment, the dimension of L2 is set to be an integral multiple of the half wavelength (i.e. $\lambda_r/2$) of the secondary harmonic wave.

Figure 12:
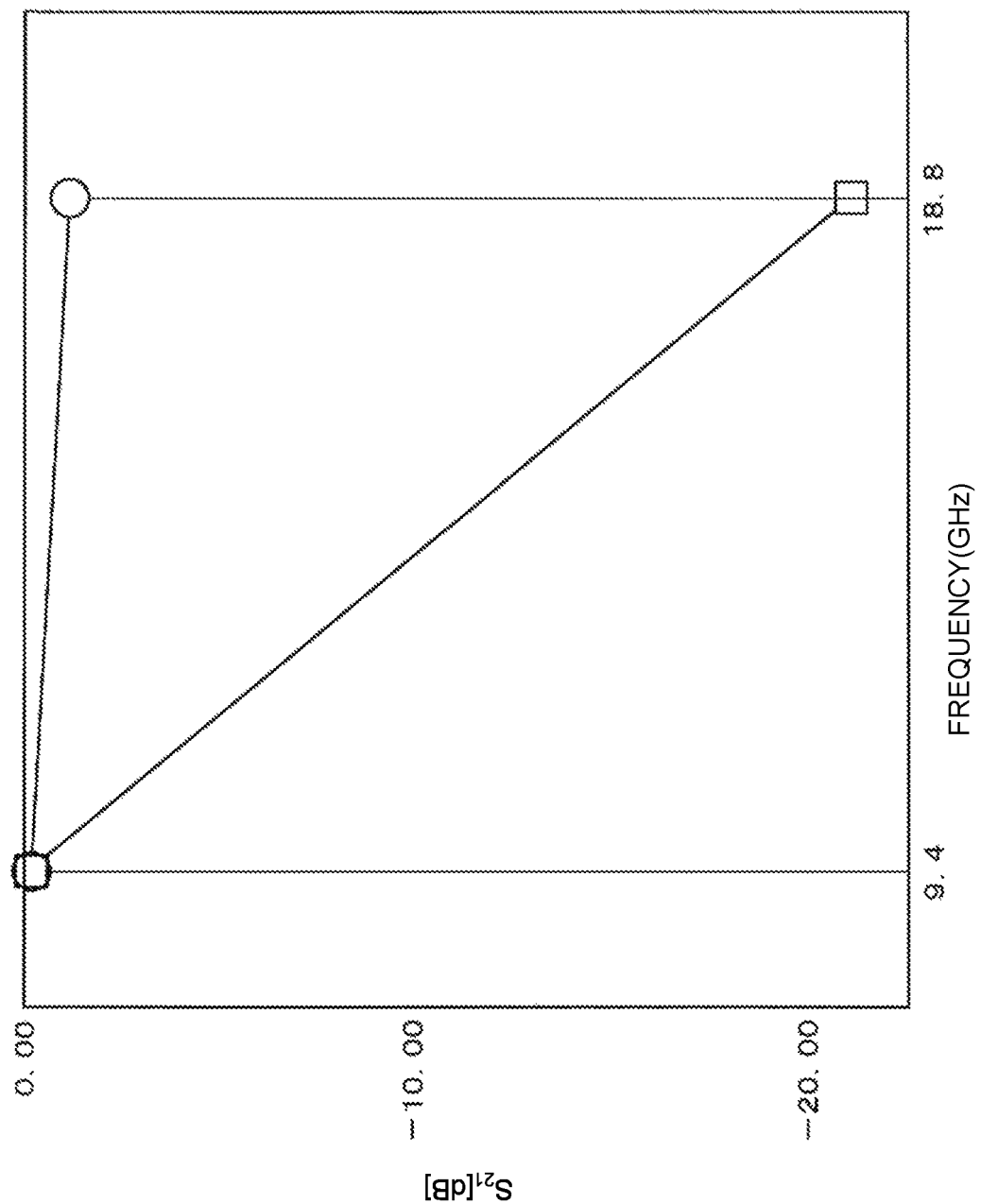
FIG. 12 is a view illustrating a state in which the graph illustrating the simulation result of the transmission characteristic of the multilayer substrate according to the embodiment and the graph illustrating the simulation result of the transmission characteristic of the multilayer substrate according to the comparative example are superimposed.
Figure 13:
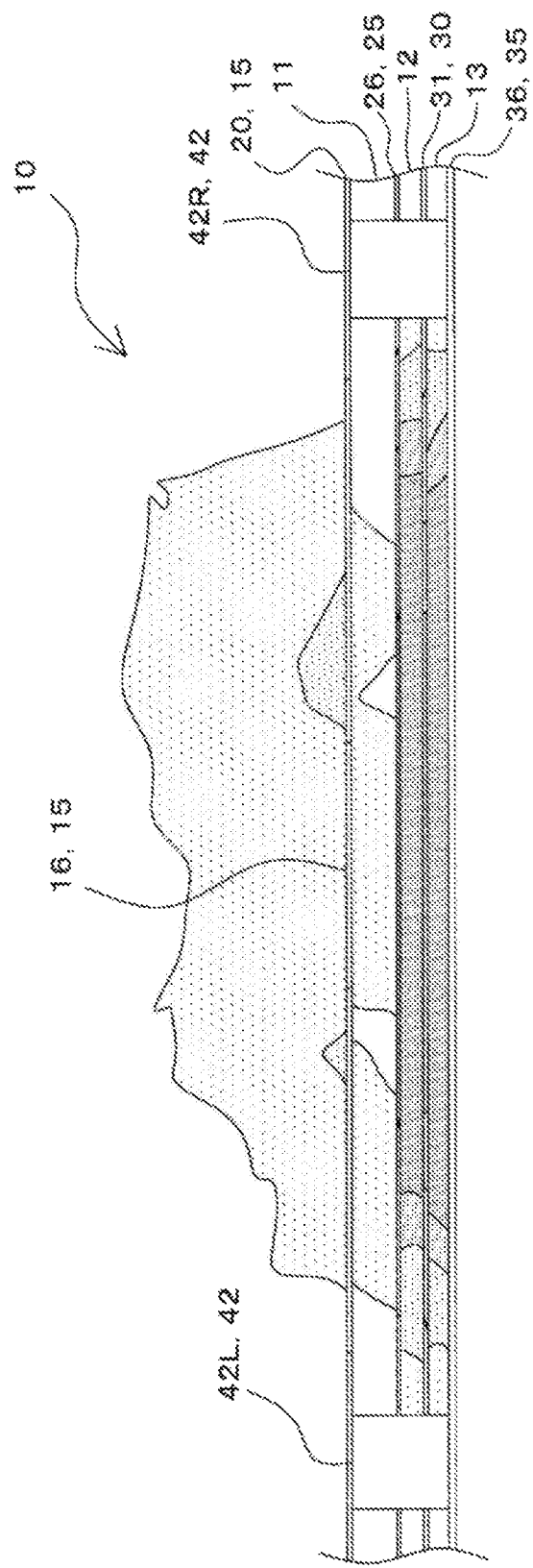
FIG. 13 is an electric field simulation of the secondary harmonic wave in the multilayer substrate according to the embodiment.
Figure 14:
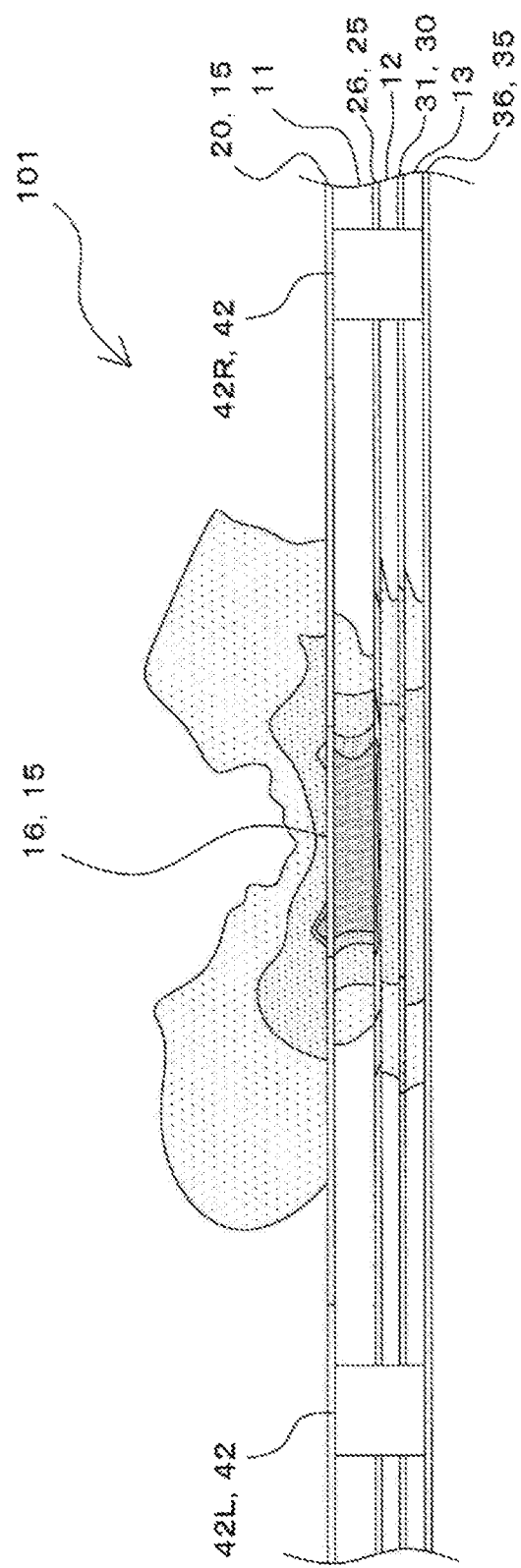
FIG. 14 is an electric field simulation of the secondary harmonic wave in the multilayer substrate according to the comparative example.

FIG. 12 is a view illustrating a state in which the graph (i.e. illustrated by a square in FIG. 12) illustrating the simulation result of the transmission characteristic $S_{21}$ (in dB) vs. frequency (in GHz) of the multilayer substrate 10 according to the embodiment and a graph (i.e. illustrated by a circle in FIG. 12) illustrating a simulation result of a transmission characteristic of a multilayer substrate 101 shown in FIG. 14 according to the comparative example are superimposed. Further, FIG. 13 is an electric field simulation of the secondary harmonic wave in the multilayer substrate 10 according to the embodiment. Further, FIG. 14 is an electric field simulation of the secondary harmonic wave in the multilayer substrate 101 according to the comparative example. Also, dimensions of the multilayer substrate 101 according to the comparative example are the same as those of the multilayer substrate 10, except for the fact that the value of L2 (FIG. 2) is set to be a value obtained by adding a quarter of the wavelength $\lambda_r$ of the secondary harmonic wave (i.e. 18.8 GHz) to a value obtained by multiplying a half wavelength (i.e. $\lambda_r/2$) of the secondary harmonic wave by an integer. Further, the electric field simulations illustrated in FIGS. 13 and 14 are electric field simulations when the multilayer substrate is seen from the input side.

As illustrated in FIG. 12, the transmission characteristic of the fundamental wave (i.e. 9.4 GHz) is substantially the same in both the multilayer substrate 10 and the multilayer substrate 101 according to the comparative example. However, regarding the transmission characteristic of the secondary harmonic wave (i.e. 18.8 GHz), the multilayer substrate 10 according to the embodiment has superior characteristics (i.e. it is difficult to transmit the secondary harmonic wave).

The inventor of the present disclosure conducted an electric field simulation, and as illustrated in FIG. 14, according to an electric field simulation result of the multilayer substrate 101 according to the comparative example, it was confirmed that the secondary harmonic wave propagates between the signal line 16 and the conductor of the second layer (i.e. the second conductive pattern 25). That is, in the multilayer substrate 101 according to the comparative example, the secondary harmonic wave is transmitted to the output side through the signal line 16.

On the other hand, according to the electric field simulation in the multilayer substrate 10 according to the embodiment, it was confirmed that the secondary harmonic wave propagates between the conductor of the second layer (i.e. the second conductive pattern 25) and the conductor of the fourth layer (i.e. the fourth conductive pattern 35), as illustrated in FIG. 13. In the second to fourth conductors (i.e. the second conductive pattern 25, the third conductive pattern 30 and the fourth conductive pattern 35), since the output sides are in an open state, it was confirmed that it is difficult for the secondary harmonic wave to propagate to the output side, as illustrated in FIG. 12.

[Regarding Dimension L3]

Referring to FIG. 2, L3 is a length of a portion of the signal line 16 included in the input side region $Z_{IN}$, that is, an input side region signal line portion 16a. In the multilayer substrate 10 according to the embodiment, by adjusting the dimension of L3, the impedance of the secondary harmonic wave may be arbitrarily set without affecting the impedance of the fundamental wave (i.e. 9.4 GHz).

Figure 15:
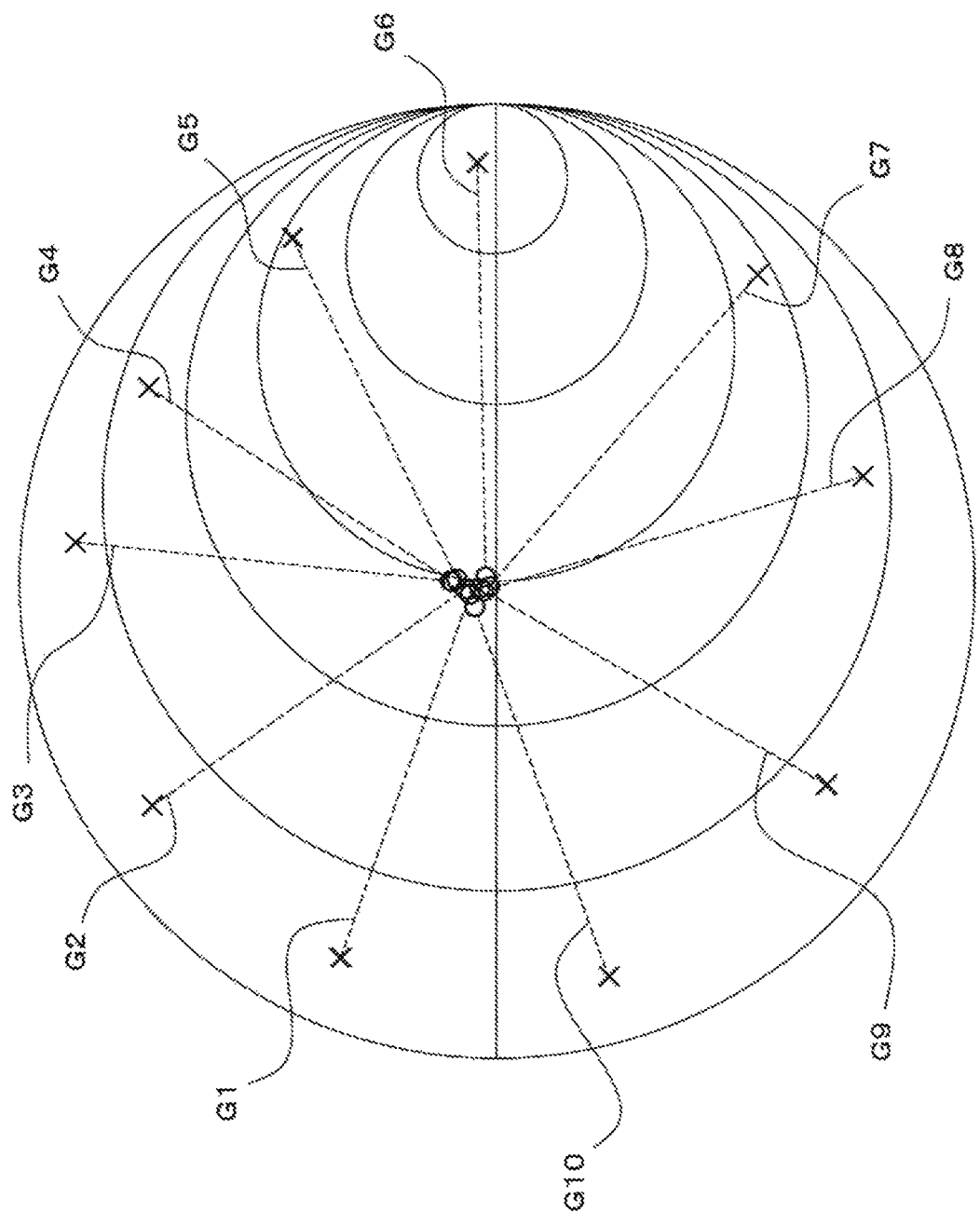
FIG. 15 is a Smith chart illustrating impedances of multilayer substrates having mutually different lengths and is a graph in which an end on the center side of the chart in each of graphs illustrated in a straight line indicates an impedance in a fundamental wave and an end on the outside of the chart in each of the graphs indicates an impedance in the secondary harmonic wave.

FIG. 15 is a Smith chart illustrating impedances of multilayer substrates 10 having mutually different lengths L3 and is a graph in which an end (i.e. illustrated by a circle) on the center side of the chart in each of graphs G1, G2, G3, G4, G5, G6, G7, G8, G9 and to G10 illustrated in a straight line indicates the impedance in the fundamental wave and an end (i.e. illustrated by an X mark) on the outside of the chart in each of the G1 to G10 indicates the impedance in the secondary harmonic wave. Further, in each of the graphs G1 to G10, a circle mark indicating the impedance in the fundamental wave and an X mark indicating the impedance in the secondary harmonic wave are connected by a broken straight line, but this is merely connecting the circle mark and the X mark with a straight line, and it is not intended that the impedance between the fundamental wave (i.e. 9.4 GHz) and the secondary harmonic wave (i.e. 18.8 GHz) is along the straight line. As illustrated in FIG. 15, it was confirmed by this simulation that the impedance of the secondary harmonic wave can be adjusted by adjusting the length of L3 without greatly affecting the impedance of the fundamental wave.

[Regarding Dimension L4 and Dimension L5]

Referring to FIG. 3, L4 is a distance between a portion of the signal line 16 included in the intermediate region $Z_{MID}$, that is, the intermediate region signal line portion 16b and the intermediate region right via 42R (or the intermediate region left via 42L) in the rightward and leftward direction. Also, L5 is a distance between the second ground pattern 26 and the fourth ground pattern 36. In the multilayer substrate 10 according to the embodiment, a value obtained by adding L4 and L5 is set to be a quarter of the wavelength $\lambda_r$ of the secondary harmonic wave (i.e. 18.8 GHz).

Referring to FIG. 3, when the dimensions of L4 and L5 are set as described above, for a point A which is in a short-circuit state with the system ground due to a connection with the system ground, a point B which is a position separated by a distance of $\lambda_r/4$ from the point A is in an open state. In this case, for the secondary harmonic wave, the ground is in a floating state, and the secondary harmonic wave is not transmitted to the output side via the signal line 16. Thus, it is possible to attenuate the harmonic wave.

Figure 16:
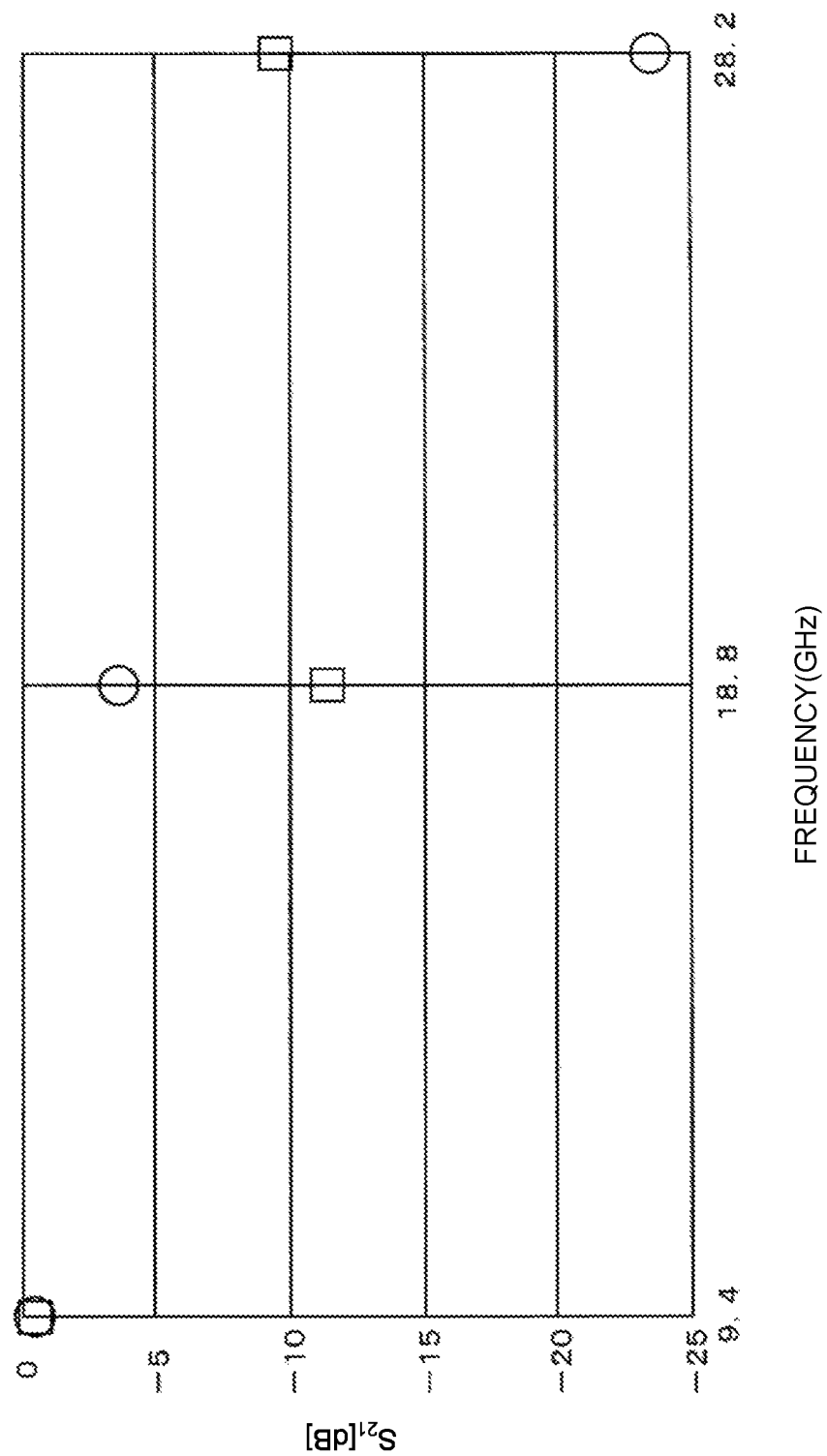
FIG. 16 is a graph illustrating the simulation result of the transmission characteristic of the multilayer substrate according to the embodiment and is a view illustrating a state in which a graph illustrating the transmission characteristic of the multilayer substrate in which a value of is set to reduce the transmission characteristic of the secondary harmonic wave and a graph illustrating the transmission characteristic of the multilayer substrate in which the value of is set to reduce the transmission characteristic of a tertiary harmonic wave are superimposed.

FIG. 16 is a graph illustrating the simulation result of the transmission characteristic of the multilayer substrate 10 according to the embodiment and is a view illustrating a state in which a graph illustrating the transmission characteristic $S_{21}$ (in dB) vs. frequency (in GHz) of the multilayer substrate 10 in which a value of L4 is set to reduce the transmission characteristic of the secondary harmonic wave and a graph illustrating the transmission characteristic of the multilayer substrate 10 in which the value of L4 is set to reduce the transmission characteristic of a tertiary harmonic wave are superimposed. When the value obtained by adding L4 and L5 is set to be a quarter of the wavelength of the secondary harmonic wave (i.e. 18.8 GHz), it was confirmed that a signal of the secondary harmonic wave can be sufficiently attenuated while a signal of the fundamental wave (i.e. 9.4 GHz) is transmitted as illustrated by the square mark in FIG. 16. Further, when the value obtained by adding L4 and 5 is set to be a quarter of the wavelength of the tertiary harmonic wave (i.e. 28.2 GHz), it was confirmed that a signal of the tertiary harmonic wave can be sufficiently attenuated while the signal of the fundamental wave (i.e. 9.4 GHz) is transmitted as illustrated by the circle mark in FIG. 16.

[Effect]

As described above, in the multilayer substrate 10 of the radar device 1 according to the embodiment in FIG. 1, the ground layers (i.e. two layers of the input side region ground layers 21 (FIG. 2) and 37 (FIG. 6) in the embodiment) formed in the input side region $Z_{IN}$, and the ground layers (i.e. two layers of the output side region ground layers 23 (FIG. 2) and 39 (FIG. 6) in the embodiment) formed in the output side region $Z_{OUT}$ are formed to have fewer layers than the ground layers (i.e. four layers of the intermediate region ground layer 22, the second ground pattern 26, the third ground pattern 31 and the intermediate region ground layer 38 in the embodiment) formed in the intermediate region $Z_{MID}$. In this case, the disturbance of the electric field in the portion in which the signal is input/output hardly occurs, and thus the quasi-TEM mode is likely to be formed in that portion. As a result, the transmission characteristic of the signal is improved.

Therefore, according to the multilayer substrate 10, it is possible to provide a multilayer substrate having a simplified configuration and excellent high frequency characteristics.

Further, in the multilayer substrate 10, two ground layers are formed in each of the input side region $Z_{IN}$ and the output side region $Z_{OUT}$, and three or more (i.e. four in the embodiment) ground layers are formed in the intermediate region $Z_{MID}$. Therefore, as can be understood from the simulation result illustrated in FIG. 7, good transmission characteristics can be obtained.

Further, in the multilayer substrate 10, the value of L1 illustrated in FIG. 2 (i.e. the distance between the intermediate region right via 42R and the intermediate region left via 42L) is set to be equal to or more than the half wavelength of the secondary harmonic wave and less than the wavelength of the secondary harmonic wave (specifically, in the present embodiment, it is set to be the half wavelength of the secondary harmonic wave). Therefore, as can be seen from the simulation result illustrated in FIG. 9, the secondary harmonic wave transmitted to the output side can be reduced.

Further, in the multilayer substrate 10, the value of L2 illustrated in FIG. 2 (i.e. the length of the intermediate region signal line portion 16b) is set to be an integral multiple of the half wavelength of the secondary harmonic wave. Therefore, as can be understood from the simulation result illustrated in FIG. 12, the secondary harmonic wave transmitted to the output side can be reduced.

Further, in the multilayer substrate 10, the value of L3 (i.e. the length of the input side region signal line portion 16a) illustrated in FIG. 2 is set on the basis of the impedance of the secondary harmonic wave to be set. In this case, as illustrated in FIG. 15, only by adjusting the value of L3, only the impedance of the secondary harmonic wave can be easily adjusted without affecting the impedance of the fundamental wave.

Further, in the multilayer substrate 10, the values of L4 and L5 are set so that the value obtained by adding L4 and L5 illustrated in FIG. 3 is a quarter of the wavelength of the secondary harmonic wave (or tertiary harmonic wave). In this case, as illustrated in FIG. 16, the secondary harmonic wave (or tertiary harmonic wave) transmitted to the output side can be reduced.

Modified Example

Although the embodiments of the present disclosure have been described above, the present disclosure is not limited thereto, and various modifications are possible without departing from the spirit of the present disclosure.

Figure 17:
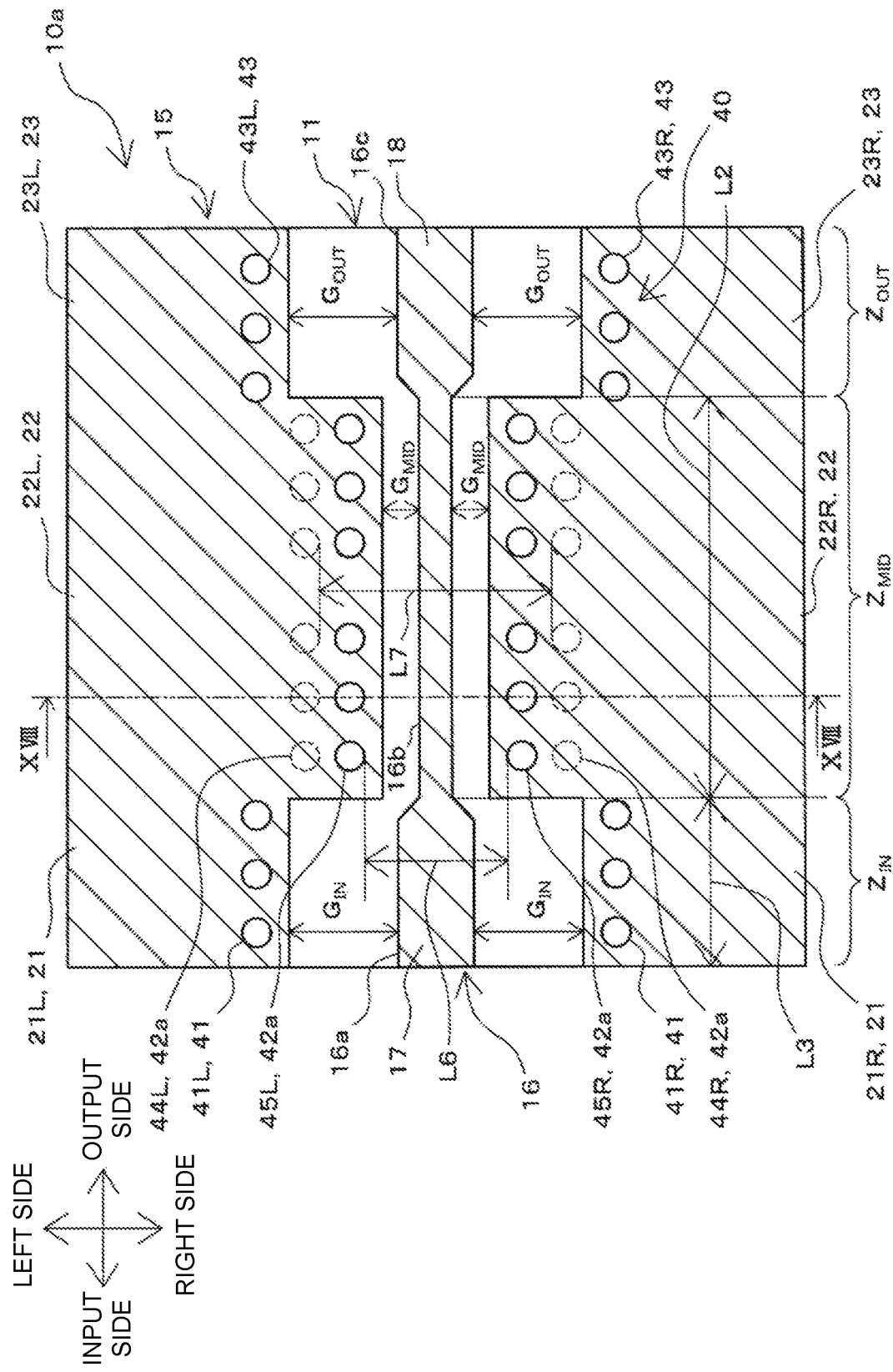
FIG. 17 is a plan view of a multilayer substrate according to a modified example and is a view illustrating a conductive pattern (i.e. first conductive pattern) of a top layer (i.e. first layer) with diagonal lines.
Figure 18:
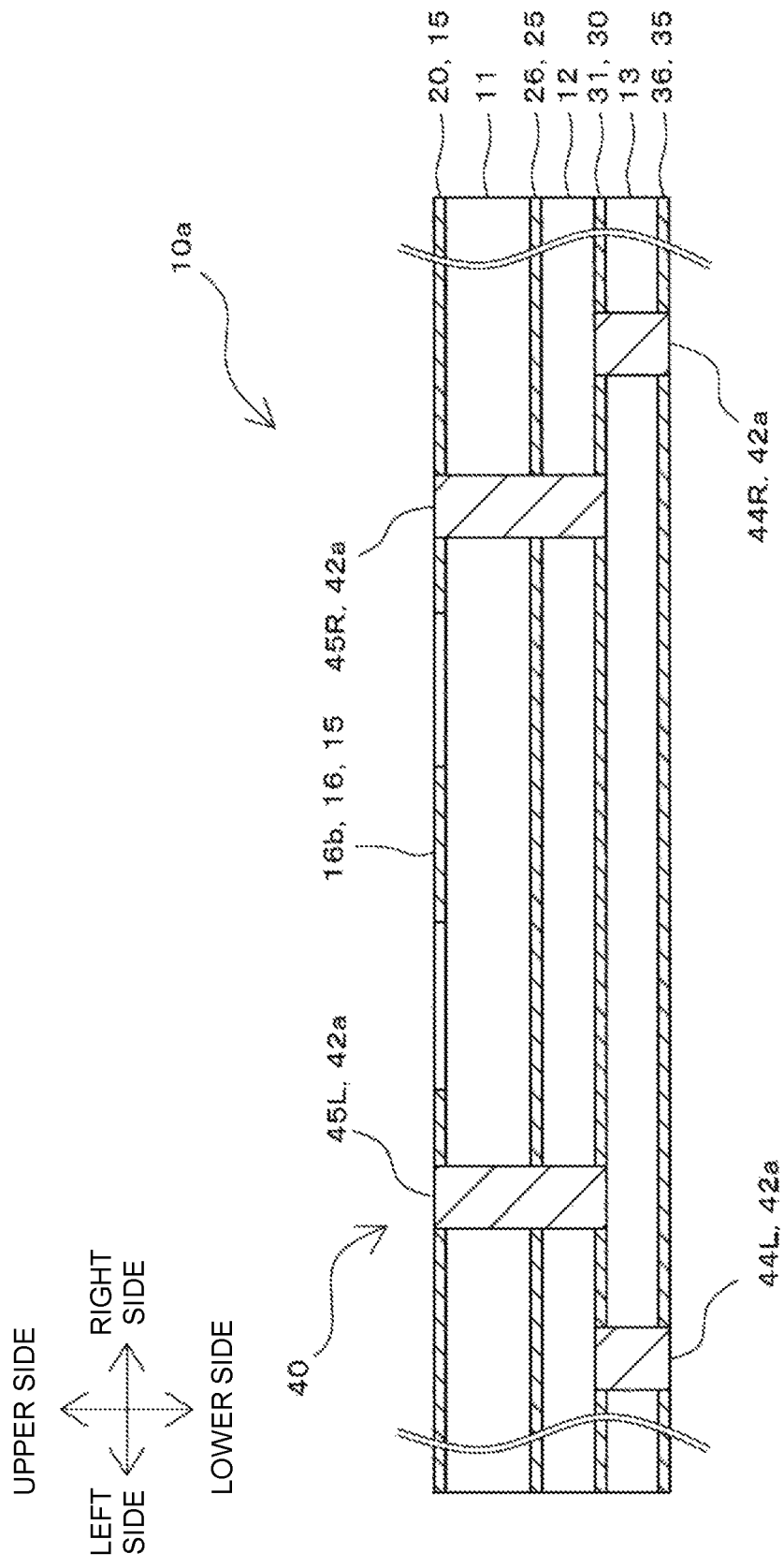
FIG. 18 is a schematic view illustrating a cross-sectional shape of the multilayer substrate taken along line XVIII-XVIII illustrated in FIG. 17 and is a view illustrating a state in which a part thereof is omitted.

(1) FIG. 17 is a plan view of a multilayer substrate 10a according to a modified example and is a view illustrating a conductive pattern (i.e. first conductive pattern) of a top layer (i.e. first layer) with diagonal lines. Further, FIG. 18 is a schematic view illustrating a cross-sectional shape of the multilayer substrate 10a taken along line XVIII-XVIII illustrated in FIG. 17 and is a view illustrating a state in which a part thereof is omitted. The multilayer substrate 10a according to the modified example has different positions and the number of vias (i.e. intermediate region vias) formed in the intermediate region $Z_{MID}$, as compared with the multilayer substrate 10 according to the above embodiment. In the following description, portions different from those of the above-described embodiment will be described, and explanation of other portions will be omitted. Further, in FIG. 18, the hatching of the dielectric layers 11, 12 and 13 is omitted to avoid making the drawing complicated.

In the multilayer substrate 10a according to a modified example, twenty-four intermediate region vias 42a are formed. Twelve of the twenty-four intermediate region vias 42a are formed on the right side in the intermediate region $Z_{MID}$, and the remaining twelve are formed on the left side in the intermediate region $Z_{MID}$.

A plurality of (i.e. six in the modified example) intermediate region rightmost vias 44R (i.e. first vias) and a plurality of (i.e. six in the modified example) intermediate region right vias 45R (i.e. third vias) are formed as the intermediate region vias 42a on the right side of the intermediate region $Z_{MID}$.

Referring to FIG. 17, the six intermediate region rightmost vias 44R are arranged in one row from the input side to the output side on the signal line 16 side in the intermediate region right ground layer 22R. Further, referring to FIG. 18, the intermediate region rightmost vias 44R are provided to extend between the third ground pattern 31 (i.e. second long distance ground layer) and the fourth ground pattern 36 (i.e. first long distance ground layer) in a vertical direction. Therefore, the third ground pattern 31 and the fourth ground pattern 36 are electrically connected.

Referring to FIG. 17, the six intermediate region right vias 45R are arranged in one row from the input side to the output side between the signal line 16 in the intermediate region right ground layer 22R and the intermediate region rightmost vias 44R. Further, referring to FIG. 18, the intermediate region right vias 45R are provided to extend between the first ground pattern 20 (i.e. reference ground layer) and the third ground pattern 31 in a vertical direction. Therefore, the first ground pattern 20, the second ground pattern 26 and the third ground pattern 31 are electrically connected.

A plurality of (i.e. six in the modified example) intermediate region leftmost vias 44L (i.e. second vias) and a plurality of (i.e. six in the modified example) intermediate region left vias 45L (i.e. fourth vias) are formed as the intermediate region vias 42a on the left side of the intermediate region $Z_{MID}$.

Referring to FIG. 17, the six intermediate region leftmost vias 44L are arranged in one row from the input side to the output side on the signal line 16 side in the intermediate region left ground layer 22L. Further, referring to FIG. 18, the intermediate region leftmost vias 44L are provided to extend between the third ground pattern 31 and the fourth ground pattern 36 in a vertical direction. Therefore, the third ground pattern 31 and the fourth ground pattern 36 are electrically connected.

Referring to FIG. 17, the six intermediate region left vias 45L are arranged in one row from the input side to the output side between the signal line 16 in the intermediate region left ground layer 22L and the intermediate region leftmost vias 44L. Further, referring to FIG. 18, the intermediate region left vias 45L are provided to extend between the first ground pattern 20 and the third ground pattern 31 in a vertical direction. Therefore, the first ground pattern 20, the second ground pattern 26 and the third ground pattern 31 are electrically connected.

[Regarding Dimensions L6 and L7]

Referring to FIG. 17, in the multilayer substrate 10a according to the embodiment, dimensions L6 and L7 are appropriately set. Accordingly, the high frequency performance of the multilayer substrate 10a can be enhanced. In the multilayer substrate 10a according to the modified example, a value of L6 is set to be a half wavelength of the wavelength of the tertiary harmonic wave (i.e. 28.2 GHz). Further, a value of L7 is set to be a half wavelength of the wavelength of the secondary harmonic wave (i.e. 18.8 GHz). In the modified example, L6 and L7 are set to be a half wavelength of the harmonic wave to be cut.

Figure 19:
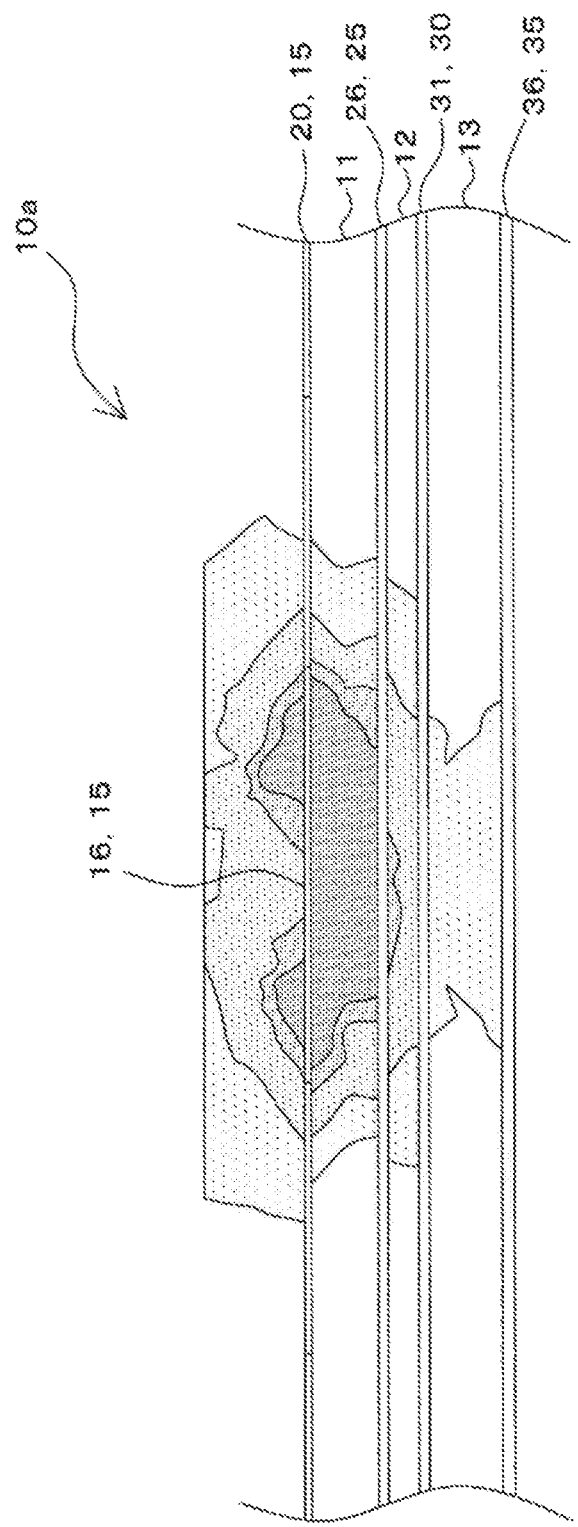
FIG. 19 is an electric field simulation of a fundamental wave in the multilayer substrate according to the modified example.
Figure 20:
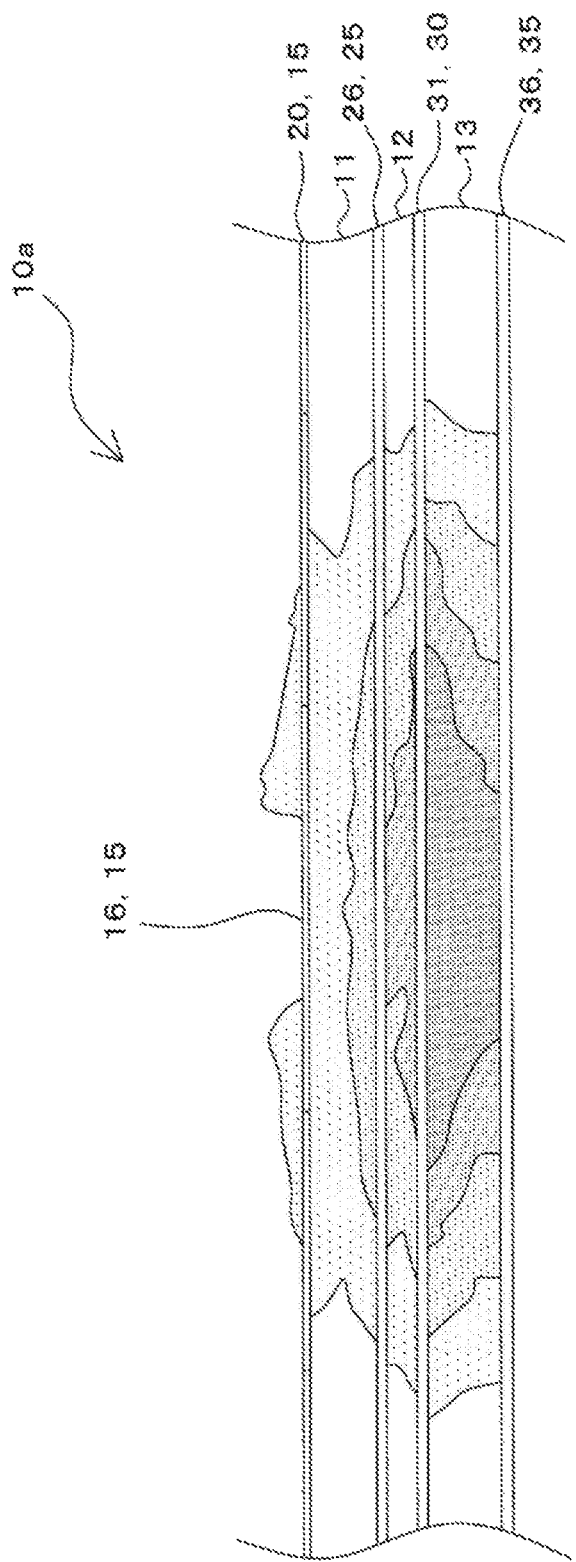
FIG. 20 is an electric field simulation of a secondary harmonic wave in the multilayer substrate according to the modified example.
Figure 21:
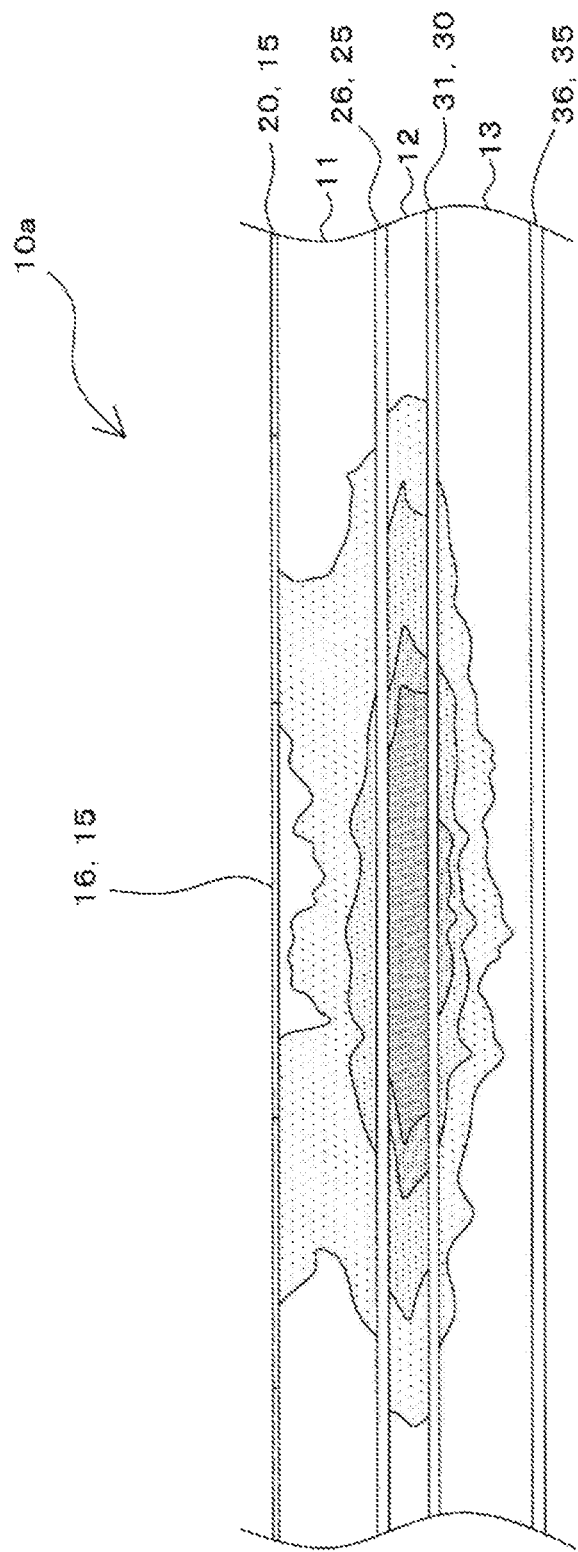
FIG. 21 is an electric field simulation of a tertiary harmonic wave in the multilayer substrate according to the modified example.

FIG. 19 is an electric field simulation of the fundamental wave in the multilayer substrate 10a according to the modified example. Further, FIG. 20 is an electric field simulation of the secondary harmonic wave in the multilayer substrate 10a according to the modified example. Further, FIG. 21 is an electric field simulation of the tertiary harmonic wave in the multilayer substrate 10a according to the modified example. Also, the electric field simulations illustrated in FIGS. 19 to 21 are electric field simulations when the multilayer substrate 10a is seen from the input side, and in the multilayer substrate 10a schematically illustrated in FIGS. 19 to 21, illustration of the via 40 is omitted.

Referring to FIG. 19, in the multilayer substrate 10a according to the modified example, for the fundamental wave, the electric field is distributed between the signal line 16 and the second ground pattern 26. That is, according to an electric field simulation result illustrated in FIG. 19, it was confirmed that the fundamental wave is transmitted to the output side via the signal line.

On the other hand, referring to FIG. 20, in the multilayer substrate 10a according to this modified example, for the secondary harmonic wave, the electric field is distributed mainly between the third ground pattern 31 and the fourth ground pattern 36. That is, according to the multilayer substrate 10a, it was confirmed that it is difficult for the secondary harmonic wave to be transmitted to the output side.

Further, referring to FIG. 21, in the multilayer substrate 10a according to the modified example, for the tertiary harmonic wave, the electric field is distributed mainly between the second ground pattern 26 and the third ground pattern 31. That is, according to the multilayer substrate 10a, it was confirmed that it is difficult for the tertiary harmonic wave to be transmitted to the output side.

As described above, according to the multilayer substrate 10a of the modified example, the value of L6 (i.e. the distance between the intermediate region right via 45R and the intermediate region left via 45L) as shown in FIG. 17 is set to be equal to or more than the half wavelength of the tertiary harmonic wave and less than the wavelength of the tertiary harmonic wave (specifically, in the present embodiment, it is set to be the half wavelength of the tertiary harmonic wave). Therefore, as can be understood from the electric field simulation result illustrated in FIG. 21, it is possible to reduce the tertiary harmonic wave transmitted to the output side.

Further, according to the multilayer substrate 10a of the modified example, the value of L7 (i.e. the distance between the intermediate region rightmost via 44R and the intermediate region leftmost via 44L) as shown in FIG. 17 is set to be equal to or more than the half wavelength of the secondary harmonic wave and less than the wavelength of the secondary harmonic wave (specifically, in the present embodiment, it is set to be the half wavelength of the secondary harmonic wave). Therefore, as can be understood from the electric field simulation result illustrated in FIG. 20, it is possible to reduce the secondary harmonic wave transmitted to the output side.

That is, according to the multilayer substrate 10a of the modified example, transmission of multiple harmonic waves (i.e. the secondary harmonic wave and tertiary harmonic wave in the embodiment) desired to reduce the transmission to the output side is easily reduced by appropriately adjusting the values of L6 and L7.

Figure 22:
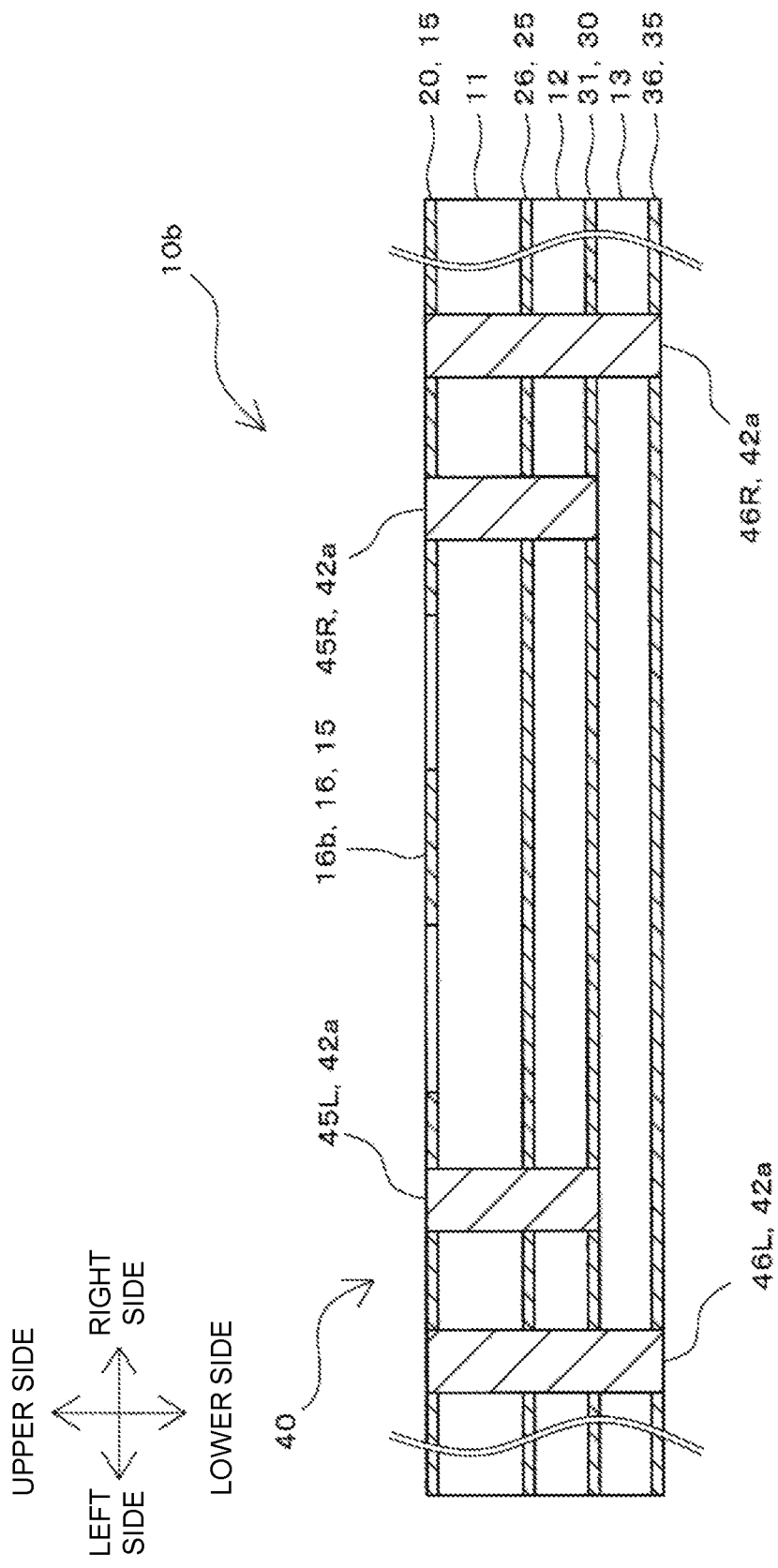
FIG. 22 is a view corresponding to FIG. 18 and schematically illustrating a cross-sectional shape of the multilayer substrate according to the modified example.

(2) FIG. 22 is a view schematically illustrating a cross-sectional shape of the multilayer substrate 10b according to the modified example to correspond to FIG. 18. In the multilayer substrate 10a illustrated in FIG. 18, the intermediate region rightmost via 44R and the intermediate region leftmost via 44L are provided to extend between the third ground pattern 31 and the fourth ground pattern 36 in the vertical direction, but the present disclosure is not limited thereto. Specifically, referring to FIG. 22, the intermediate region rightmost via 46R and the intermediate region leftmost via 46L may be provided to extend between the first ground pattern 20 and the fourth ground pattern 36 in the vertical direction. Even in this case, it is possible to obtain the same effects as those of the multilayer substrate 10a illustrated in FIGS. 17 and 18. Further, in FIG. 22, the hatching of the dielectric layers 11, 12 and 13 is omitted to avoid making the drawing complicated.

REFERENCE SIGNS LIST

1 Radar device
10, 10a, 10b Multilayer substrate
11 First dielectric layer (i.e. dielectric layer)
12 Second dielectric layer (i.e. dielectric layer)
13 Third dielectric layer (i.e. dielectric layer)
16 Signal line
20 First ground pattern (i.e. ground layer)
21 Input side region ground layer (i.e. input side ground layer)
22 Intermediate region ground layer (i.e. intermediate ground layer)
23 Output side region ground layer (i.e. output side ground layer)
26 Second ground pattern (i.e. ground layer, intermediate ground layer)
31 Third ground pattern (i.e. ground layer, intermediate ground layer)
36 Fourth ground pattern (i.e. ground layer)
37 Input side region ground layer (i.e. input side ground layer)
38 intermediate region ground layer (i.e. intermediate ground layer)
39 Output side region ground layer (i.e. output side ground layer)
40 Via

The invention claimed is:

1. A multilayer substrate, being divided into an input side region, an intermediate region, and an output side region in this order in a plan view, and the multilayer substrate comprising:
a plurality of dielectric layers;
a plurality of ground layers, provided on both surfaces of each of the plurality of dielectric layers, and the plurality of dielectric layers being stacked on each other via the ground layers;
a signal line, provided on a surface of one of the plurality of dielectric layers that is provided at a top side of the plurality of dielectric layers, and the signal line extending from the input side region through the intermediate region to the output side region; and
a plurality of vias, electrically connecting the plurality of ground layers by passing through at least one of the plurality of dielectric layers in a stacking direction of the plurality of dielectric layers, wherein
the plurality of ground layers comprises:
a plurality of input side ground layers, provided in the input side region where the signal line through which a signal is input,
a plurality of output side ground layers, provided in the output side region where the signal line through which the signal is output, and
a plurality of intermediate ground layers, provided in the intermediate region, and the intermediate ground layers being disposed between the input side ground layers and the output side ground layers, and
the input side ground layers provided in the input side region have fewer layers than the intermediate ground layer provided in the intermediate region, and
the output side ground layers provided in the output side region have fewer layers than the intermediate ground layer provided in the intermediate region;
wherein the plurality of vias have a plurality of first vias, a plurality of second vias, a plurality of third vias and a plurality of fourth vias provided in the intermediate ground layer,
the plurality of first vias is arranged in a direction parallel to the signal line on one side of the signal line in a width direction, the plurality of second vias is arranged in a direction parallel to the signal line on an other side of the signal line in the width direction, the plurality of third vias is arranged in a direction parallel to the signal line between the plurality of first vias and the signal line, the plurality of fourth vias is arranged in a direction parallel to the signal line between the plurality of second vias and the signal line, a ground layer disposed in the same layer as the signal line among the plurality of ground layers is provided as a reference ground layer, a ground layer disposed on a side furthest from the reference ground layer among the plurality of ground layers in the stacking direction is provided as a first long distance ground layer, a ground layer closest to the first long distance ground layer among the plurality of ground layers in the stacking direction is provided as a second long distance ground layer, the first via and the second via extend in the stacking direction to electrically connect the first long distance ground layer and the second long distance ground layer, or electrically connect the reference ground layer and the first long distance ground layer, and a distance between the first via and the second via is set to be equal to or more than a half wavelength of a secondary harmonic wave of the signal transmitted and received through the signal line and less than a wavelength of the secondary harmonic wave, and the third via and the fourth via extend in the stacking direction to electrically connect the reference ground layer and the second long distance ground layer, and a distance between the third via and the fourth via is set to be equal to or more than a half wavelength of a tertiary harmonic wave of the signal transmitted and received through the signal line and less than a wavelength of the tertiary harmonic wave.

2. The multilayer substrate according to claim 1, wherein two input side ground layers and two output side ground layers are provided, and three or more intermediate ground layers are provided.

3. The multilayer substrate according to claim 2, wherein the plurality of first vias and the plurality of second vias are provided in the intermediate region.

4. The multilayer substrate according to claim 2, wherein the plurality of first vias and the plurality of second vias are provided in the intermediate region, the ground layer provided on a side closest to the ground layer disposed in the same layer as the signal line among the plurality of ground layers in the stacking direction is provided as a short distance ground layer, the ground layer provided on a side furthest from the ground layer disposed in the same layer as the signal line among the plurality of ground layers in the stacking direction is provided as a long distance ground layer, and a value obtained by adding a distance from an intermediate region signal line portion of the signal line provided in the intermediate region to the first via or the second via and a distance from the short distance ground layer to the long distance ground layer is set to be a quarter of the wavelength of the secondary harmonic wave transmitted and received through the signal line.

5. A radar device comprising the multilayer substrate according to claim 2.

6. The multilayer substrate according to claim 1, wherein the plurality of first vias and the plurality of second vias are provided in the intermediate region, a ground layer provided on a side closest to the ground layer disposed in the same layer as the signal line among the plurality of ground layers in the stacking direction is provided as a short distance ground layer, a ground layer provided on a side furthest from the ground layer disposed in the same layer as the signal line among the plurality of ground layers in the stacking direction is provided as a long distance ground layer, and a value obtained by adding a distance from an intermediate region signal line portion of the signal line provided in the intermediate region to the first via or the second via and a distance from the short distance ground layer to the long distance ground layer is set to be a quarter of the wavelength of the secondary harmonic wave transmitted and received through the signal line.

7. A radar device comprising the multilayer substrate according to claim 6.

8. A radar device comprising the multilayer substrate according to claim 1.

9. The multilayer substrate according to claim 1, wherein the plurality of first vias and the plurality of second vias are provided in the intermediate region.

10. The multilayer substrate according to claim 9, wherein the plurality of first vias and the plurality of second vias are provided in the intermediate region, the ground layer provided on a side closest to the ground layer disposed in the same layer as the signal line among the plurality of ground layers in the stacking direction is provided as a short distance ground layer, the ground layer provided on a side furthest from the ground layer disposed in the same layer as the signal line among the plurality of ground layers in the stacking direction is provided as a long distance ground layer, and a value obtained by adding a distance from an intermediate region signal line portion of the signal line provided in the intermediate region to the first via or the second via and a distance from the short distance ground layer to the long distance ground layer is set to be a quarter of the wavelength of the secondary harmonic wave transmitted and received through the signal line.

11. A radar device comprising the multilayer substrate according to claim 9.

12. The multilayer substrate according to claim 9, wherein a length of an intermediate region signal line portion of the signal line provided in the intermediate region is set to be an integral multiple of the half wavelength of the secondary harmonic wave.

13. The multilayer substrate according to claim 12, wherein the plurality of first vias and the plurality of second vias are provided in the intermediate region, the ground layer provided on a side closest to the ground layer disposed in the same layer as the signal line among the plurality of ground layers in the stacking direction is provided as a short distance ground layer, the ground layer provided on a side furthest from the ground layer disposed in the same layer as the signal line among the plurality of ground layers in the stacking direction is provided as a long distance ground layer, and a value obtained by adding a distance from the intermediate region signal line portion of the signal line provided in the intermediate region to the first via or the second via and a distance from the short distance ground layer to the long distance ground layer is set to be a quarter of the wavelength of the secondary harmonic wave transmitted and received through the signal line.

14. The multilayer substrate according to claim 12, wherein
a length of an input side region signal line portion of the signal line provided in the input side region is set on the basis of an impedance of the secondary harmonic wave.

15. A radar device comprising the multilayer substrate according to claim 12.

16. The multilayer substrate according to claim 9, wherein
a length of an input side region signal line portion of the signal line provided in the input side region is set on the basis of an impedance of the secondary harmonic wave.

17. The multilayer substrate according to claim 16, wherein
the plurality of first vias and the plurality of second vias are provided in the intermediate region,
the ground layer provided on a side closest to the ground layer disposed in the same layer as the signal line among the plurality of ground layers in the stacking direction is provided as a short distance ground layer,
the ground layer provided on side furthest from the ground layer disposed in the same layer as the signal line among the plurality of ground layers in the stacking direction is provided as a long distance ground layer, and
a value obtained by adding a distance from an intermediate region signal line portion of the signal line provided in the intermediate region to the first via or the second via and a distance from the short distance ground layer to the long distance ground layer is set to be a quarter of the wavelength of the secondary harmonic wave transmitted and received through the signal line.

18. A radar device comprising the multilayer substrate according to claim 16.

* * * * *